United States Patent
Kim et al.

(10) Patent No.: US 11,705,544 B2
(45) Date of Patent: Jul. 18, 2023

(54) DISPLAY DEVICE WITH LOW REFRACTIVE LAYER DISPOSED ON COLOR CONVERSION LAYER

(71) Applicant: Samsung Display Co., LTD., Yongin-si (KR)

(72) Inventors: Young Gu Kim, Yongin-si (KR); Ji Yun Park, Yongin-si (KR); Bong Sung Seo, Yongin-si (KR); Jong Ho Son, Yongin-si (KR); Yeon Hee Lee, Yongin-si (KR); Baek Kyun Jeon, Yongin-si (KR); Kyung Seon Tak, Yongin-si (KR); Jae Jin Lyu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 135 days.

(21) Appl. No.: 17/319,624

(22) Filed: May 13, 2021

(65) Prior Publication Data

US 2022/0123183 A1    Apr. 21, 2022

(30) Foreign Application Priority Data

Oct. 19, 2020  (KR) .......... 10-2020-0135497

(51) Int. Cl.
*H01L 33/58*     (2010.01)
*H01L 25/075*    (2006.01)
*H01L 27/12*     (2006.01)
*H01L 33/50*     (2010.01)
*B82Y 20/00*     (2011.01)

(52) U.S. Cl.
CPC .......... *H01L 33/58* (2013.01); *H01L 25/0753* (2013.01); *H01L 27/1214* (2013.01); *H01L 33/502* (2013.01); *B82Y 20/00* (2013.01); *H01L 2933/0091* (2013.01)

(58) Field of Classification Search
CPC .... H01L 33/58; H01L 25/0753; H01L 33/502
See application file for complete search history.

(56) References Cited

U.S. PATENT DOCUMENTS

| | | | |
|---|---|---|---|
| 2019/0041701 A1* | 2/2019 | Chen ................. | G02F 1/133617 |
| 2019/0206956 A1* | 7/2019 | Kim ................... | H01L 27/3246 |
| 2019/0310522 A1 | 10/2019 | Chu et al. | |
| 2020/0081292 A1 | 3/2020 | Park et al. | |
| 2020/0142119 A1 | 5/2020 | Kim et al. | |
| 2020/0183224 A1* | 6/2020 | Lee ................... | G02F 1/133514 |
| 2020/0217998 A1 | 7/2020 | Jung et al. | |
| 2022/0262984 A1* | 8/2022 | Choi .................. | H01L 25/0753 |

FOREIGN PATENT DOCUMENTS

| | | |
|---|---|---|
| EP | 3 605 623 | 2/2020 |
| JP | 2015-128027 | 7/2015 |
| KR | 10-2016-0056335 | 5/2016 |
| KR | 10-2019-0118224 | 10/2019 |
| KR | 10-2020-0030147 | 3/2020 |
| KR | 10-2020-0053031 | 5/2020 |
| KR | 10-2020-0086413 | 7/2020 |

* cited by examiner

Primary Examiner — Tracie Y Green
(74) Attorney, Agent, or Firm — Kile Park Reed & Houtteman PLLC

(57) ABSTRACT

A display device includes a bank including an opening defining a plurality of pixels; a plurality of light emitting elements disposed in the plurality of pixels; a color conversion layer disposed on the plurality of light emitting elements in the opening; and a low refractive layer disposed on the color conversion layer in the opening.

21 Claims, 15 Drawing Sheets

DISPLAY DEVICE WITH LOW REFRACTIVE LAYER DISPOSED ON COLOR CONVERSION LAYER

CROSS-REFERENCE TO RELATED APPLICATION(S)

This application claims priority to and the benefit of Korean Patent Application No. 10-2020-0135497 under 35 U.S.C. § 119, filed in the Korean Intellectual Property Office (KIPO) on Oct. 19, 2020, the entire contents of which are incorporated herein by reference.

BACKGROUND

1. Technical Field

The disclosure relates to a display device.

2. Description of the Related Art

Recently, as interest in an information display is increasing, research and development for display devices have been continuously conducted.

SUMMARY

The disclosure provides a display device that may secure cost competitiveness.

The objects of the disclosure are not limited to the object mentioned above, and other technical objects that are not mentioned may be clearly understood to a person of an ordinary skill in the art using the following description.

An embodiment provides a display device including a bank including an opening defining a plurality of pixels; a plurality of light emitting elements disposed in the plurality of pixels; a color conversion layer disposed on the plurality of light emitting elements in the opening; and a low refractive layer disposed on the color conversion layer in the opening.

The low refractive layer may be disposed on the color conversion layer and directly contact the color conversion layer.

The low refractive layer may include at least one surface that contacts at least one of the bank, a capping layer, and the color conversion layer in the opening.

The low refractive layer may include an edge portion contacting the bank in the opening, and a central portion surrounded by the edge portion, and a thickness of the edge portion of the low refractive layer may be thicker than a thickness of the central portion of the low refractive layer.

The display device may further include a capping layer overlapping the low refractive layer.

A surface of the low refractive layer may contact the color conversion layer, and another surface of the low refractive layer may contact the capping layer.

The capping layer may be disposed on the bank and directly contact the bank.

The capping layer may include at least one of a silicon oxide ($SiO_x$), a silicon nitride ($SiN_x$), a silicon oxynitride ($SiO_xN_y$), an aluminum oxide ($AlO_x$), and a titanium oxide ($TiO_x$).

A surface of the bank may have liquid repellency.

The display device may further include a color filter layer overlapping the color conversion layer. The low refractive layer may be disposed between the color conversion layer and the color filter layer.

The low refractive layer may include a hollow particle.

The color conversion layer may include a base resin, and quantum dots dispersed in the base resin.

The display device may further include a capping layer disposed between the color conversion layer and the low refractive layer.

The display device may further include an inclination pattern disposed on the bank, and an inclination angle of the inclination pattern with respect to a substrate is smaller than an inclination angle of the bank with respect to the substrate.

Another embodiment provides a display device including a bank including an opening defining a plurality of pixels; a plurality of light emitting elements disposed in the plurality of pixels; a color conversion layer disposed on the plurality of light emitting elements in the opening; and a low refractive layer disposed on the color conversion layer. The low refractive layer may overlap a surface of the bank exposed by the color conversion layer.

The low refractive layer may be disposed on the color conversion layer and directly contact the color conversion layer.

The low refractive layer may be disposed on the bank and directly contact the bank.

A thickness of the low refractive layer on the color conversion layer may be thicker than a thickness of the low refractive layer on the bank.

The display device may further include a capping layer overlapping the low refractive layer.

A surface of the low refractive layer may contact the color conversion layer, and another surface of the low refractive layer may contact the capping layer.

Particularities of other embodiments are included in the detailed description and drawings.

According to the embodiment of the disclosure, since a low refractive layer is disposed in an opening of a bank, an amount of application of a low refractive material may be reduced, thereby securing cost competitiveness.

Effects of embodiments of the disclosure are not limited by what is illustrated in the above, and more various effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
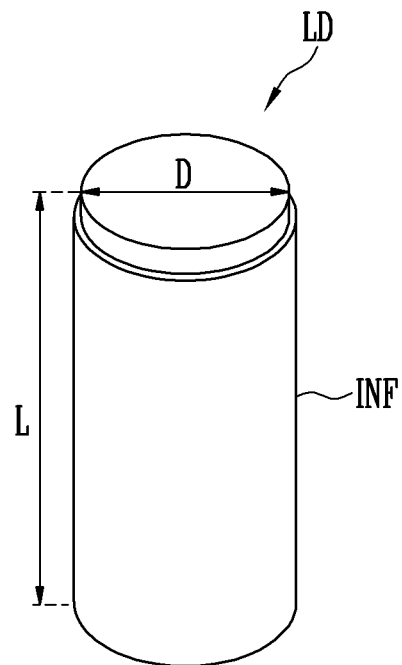
FIG. 1 and FIG. 2 schematically illustrates a perspective view and a cross-sectional view of a light emitting element according to an embodiment, respectively.

Advantages and features of the disclosure and methods of accomplishing the same may be understood more readily by reference to the following detailed description of embodiments and the accompanying drawings. The disclosure may, however, be embodied in different forms and should not be construed as being limited to the embodiments set forth herein. The embodiments are provided so that this disclosure will be more thorough and complete, and will convey the scope of the disclosure to those skilled in the art, and further, the claimed invention is only defined by scopes of claims.

The terms used herein are for the purpose of describing particular embodiments only and is not intended to be limiting. As used herein, the singular forms "a," "an" and "the" are intended to include the plural forms as well, unless the context clearly indicates otherwise. It will be further understood that the terms "comprise" or "comprising," "include" or "including," and "have" or "having," when used in the disclosure, specify the presence of stated elements, steps, operations, and/or devices, but do not preclude the presence or addition of one or more other elements, steps, operations, and/or devices.

In addition, the term "connection," "contact," or "coupling" may mean a physical and/or electrical connection or coupling. Further, this term may mean a direct or indirect connection or coupling, or an integrated or non-integrated connection or coupling (e.g., elements being integral or not integral with each other).

It will be understood that when an element or a layer is referred to as being on another element or layer, it can be directly on another element or layer, or intervening element or layer may also be present. Throughout the specification, the same reference numerals denote the same constituent elements.

Although the terms "first," "second," and the like are used to describe various constituent elements, these elements are not limited by these terms. These terms are used only to distinguish one element from another element. Therefore, the first elements described below may be the second elements within the technical spirit of the disclosure.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 2:
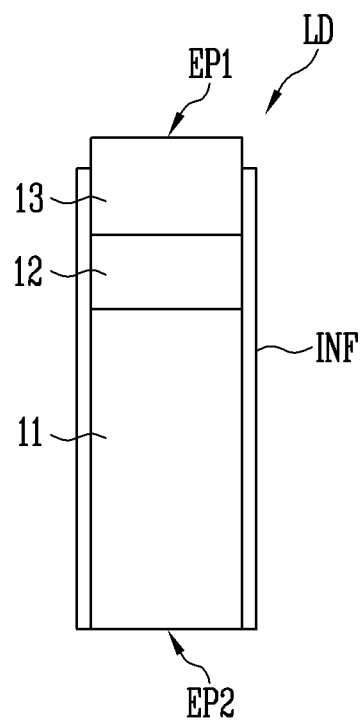

FIGS. 1 and 2 illustrates a schematic perspective view and a schematic cross-sectional view of a light emitting element according to an embodiment, respectively. FIGS. 1 and 2 illustrate a cylindrical shape light emitting element (or light emitting device) LD, but a type and/or shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, in case that an extending direction of the light emitting element LD is referred to as a length direction, the light emitting element LD may include the first semiconductor layer 11, the active layer 12, and the second semiconductor layer 13 sequentially stacked in the length direction.

The light emitting element LD may have a cylindrical shape extending in a direction. The light emitting element LD may have a first end portion EP1 and a second end portion EP2. One of the first and second semiconductor layers 11 and 13 may be disposed on the first end portion EP1 of the light emitting element LD. The other of the first and second semiconductor layers 11 and 13 may be disposed on the second end portion EP2 of the light emitting element LD.

In some embodiments, the light emitting element LD may be a light emitting element manufactured in a cylindrical shape by an etching method or the like. In the specification, the "cylindrical shape" may include a rod- or bar-like shape (for example, having an aspect ratio greater than one) that is long in the length direction (L), such as a circular cylinder or a polygonal cylinder, but a shape of a cross-section thereof is not limited to a particular shape. For example, the length L of the light emitting element LD may be greater than a diameter D thereof (or a width of a lateral cross-section thereof).

The light emitting element LD may have a size in a range of a nanometer scale to a micrometer scale. For example, the light emitting element LD may each have the diameter D (or width) and/or the length L ranging from a nanometer scale to a micrometer scale. However, the size of the light emitting element LD is not limited thereto, and the size of the light emitting element LD may be variously changed according to design conditions of various devices, for example, a display device, using, as a light source, a light emitting device using the light emitting element LD.

The first semiconductor layer 11 may be a first conductive semiconductor layer. For example, the first semiconductor layer 11 may include an N-type semiconductor layer. For example, the first semiconductor layer 11 may include a semiconductor material of one of InAlGaN, GaN, AlGaN, InGaN, AlN, and InN and may include a N-type semiconductor layer doped with a first conductive dopant such as Si, Ge, Sn, or the like. However, the material forming the first semiconductor layer 11 is not limited thereto, and the first semiconductor layer 11 may be made of various materials.

The active layer 12 may be disposed on the first semiconductor layer 11 and may be formed to have a single- or multi-quantum well structure. A position of the active layer 12 may be variously changed according to a type of the light emitting element LD.

A clad layer (not shown) doped with a conductive dopant may be formed on and/or under the active layer 12. For example, the cladding layer may be formed of AlGaN or InAlGaN. In some embodiments, a material such as AlGaN and InAlGaN may be used to form the active layer 12, and various materials may form the active layer 12.

The second semiconductor layer 13 may be disposed on the active layer 12 and may include a semiconductor layer of a type different from that of the first semiconductor layer 11. For example, the second semiconductor layer 13 may include a P-type semiconductor layer. For example, the second semiconductor layer 13 may include at least one semiconductor material, e.g., InAlGaN, GaN, AlGaN, InGaN, AlN, and InN, and may include a P-type semiconductor layer doped with a second conductive dopant such as Mg. However, the material included in the second semiconductor layer 13 is not limited thereto, and the second semiconductor layer 13 may be formed of various materials.

In case that a voltage equal to or greater than a threshold voltage is applied to respective end portions of the light emitting element LD, the light emitting device LD may emit light while electron-hole pairs are combined in the active layer 12. By controlling the light emission of the light emitting element LD by using this principle, the light emitting element LD may be used as a light source for various light emitting devices including pixels of a display device.

The light emitting element LD may further include an insulation film INF provided on a surface thereof. The insulation film INF may be formed on the surface of the light emitting device LD so as to surround at least an outer circumferential surface of the active layer 12 and may further surround regions of the first and second semiconductor layers 11 and 13.

In some embodiments, the insulation film INF may expose respective end portions of the light emitting element LD having different polarities. For example, the insulation film INF may expose an end portion of each of the first and second semiconductor layers 11 and 13 disposed at the first and second end portions EP1 and EP2 of the light emitting element LD. In another embodiment, the insulation film INF may expose side portions of the first and second semiconductor layers 11 and 13 adjacent to the first and second end portions EP1 and EP2 of the light emitting element LD having different polarities.

In some embodiments, the insulation film INF may be formed as a single layer or multi-layer (for example, a double layer made of an aluminum oxide ($AlO_x$) and a silicon oxide ($SiO_x$)) including at least one insulating material of a silicon oxide ($SiO_x$), a silicon nitride ($SiN_x$), a silicon oxynitride ($SiO_xN_y$), an aluminum oxide ($AlO_x$), and a titanium oxide ($TiO_x$), but the disclosure is not limited thereto. In some embodiments, the insulation film INF may be omitted.

In case that the insulation film INF covers or overlaps a surface of the light emitting element LD, particularly, a circumferential surface of the active layer 12, it is possible to prevent the active layer 12 from being short-circuited with a first pixel electrode or a second pixel electrode to be described below. Therefore, electrical stability of the light emitting element LD may be secured.

In case that the insulation film INF is provided on the surface of the light emitting element LD, it is possible to improve the lifespan and efficiency thereof by reducing or minimizing defects in the surface of the light emitting element LD. Further, it is possible to prevent an unwanted short circuit between the light emitting elements LD from occurring even in case that light emitting elements LD are disposed close to each other.

In an embodiment, the light emitting element LD may further include an additional element in addition to the first semiconductor layer 11, the active layer 12, the second semiconductor layer 13, and/or the insulation film INF surrounding them. For example, the light emitting element LD may additionally include one or more of a phosphor layer, an active layer, a semiconductor layer, and/or an electrode layer disposed on end portions of the first semiconductor layer 11, the active layer 12, and/or the second semiconductor layer 13. For example, a contact electrode layer may be disposed at each of the first and second end portions EP1 and EP2 of the light emitting element LD. FIGS. 1 and 2 illustrate the cylindrical light emitting element LD, but the type, structure, and/or shape of the light emitting element LD may be variously changed. For example, the light emitting element LD may be formed in a core-shell structure having a polygonal horn or polypyramidal shape.

A light emitting element (or light emitting device) LD described above may be used in various types of devices including a display device that require a light source. For example, light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices such as a lighting device that includes a light source.

Figure 3:
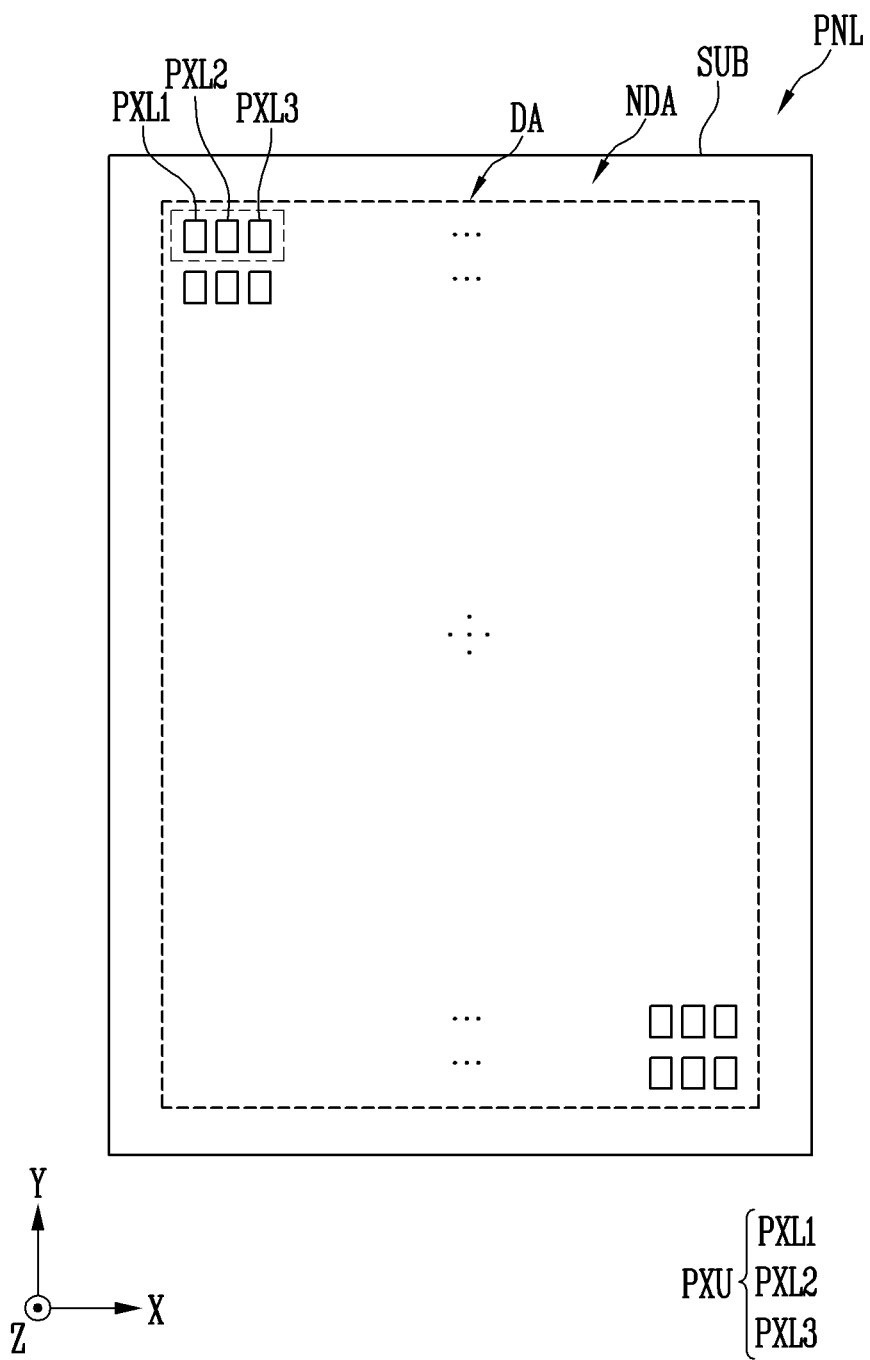
FIG. 3 schematically illustrates a top plan view of a display device according to an embodiment.

FIG. 3 illustrates a schematic plan view of a display device according to an embodiment.

FIG. 3 illustrates a display device, in particular, a display panel PNL provided in the display device as an example of an electronic device that may use, as a light source, the light emitting element LD described in the embodiments of FIGS. 1 and 2.

Each pixel unit PXU of the display panel PNL and each pixel configuring the same may include at least one light emitting element LD. For better understanding and ease of description, FIG. 3 briefly illustrates the structure of the display panel PNL based on a display area DA. However, in some embodiments, at least one driving circuit portion (for example, at least one of a scan driver and a data driver), wires or lines, and/or pads, which are not shown, may be further disposed in the display panel PNL.

Referring to FIG. 3, the display panel PNL may include a substrate SUB and the pixel unit PXU disposed on the substrate SUB. The pixel unit PXU may include first pixels PXL1, second pixels PXL2, and/or third pixels PXL3. Hereinafter, one or more pixels among the first pixels PXL1, the second pixels PXL2, and the third pixels PXL3, or two or more types of pixels may be referred to as a "pixel PXL" or "pixels PXL."

The substrate SUB may form a base member of the display panel PNL and may be a rigid or flexible substrate or film. For example, the substrate SUB may be a rigid substrate made of (or include) glass or tempered glass, a flexible substrate (or a thin film) made of a plastic or metallic material, or at least one layered insulation layer. The material and/or physical properties of the substrate SUB are not particularly limited.

The display panel PNL and the substrate SUB for forming the display panel may include a display area DA for displaying an image and a non-display area NDA excluding the display area DA. The pixels PXL may be disposed in the display area DA. In the non-display area NDA, various lines electrically connected to the pixels PXL of the display area DA, pads, and/or internal circuit parts may be disposed. The pixels PXL may be regularly arranged according to a stripe or PenTile® arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one first to third pixels PXL1, PXL2, and PXL3 disposed to be adjacent to each other may form a pixel unit PXU that may emit light of various colors. For example, each of the first to third pixels PXL1, PXL2, and PXL3 may be a sub-pixel emitting light of a predetermined color. In some embodiments, the first pixel PXL1 may be a red pixel that emits red light, the second pixel PXL2 may be a green pixel that emits green light, and the third pixel PXL3 may be a blue pixel that emits blue light, but the disclosure is not limited thereto.

In an embodiment, the first pixel PXL1, the second pixel PXL2, and the third pixel PXL3 may be provided with a first color light emitting element, a second color light emitting element, and a third color light emitting element as light sources, respectively, so that they respectively emit light of the first color, second color, and third color. In another embodiment, the first pixel PXL1, the second pixel PXL2, and the third pixel PXL3 may be provided with light emitting elements emitting light of a same color and include color conversion layers and/or color filters of different colors disposed on respective light emitting elements, so that they may emit light of the first color, the second color, and the third color. However, the color, type, and/or number of pixels PXL forming each pixel unit PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In an embodiment, the light source may include at least one light emitting device LD according to one of the embodiments of FIGS. 1 and 2, for example, ultra-small cylindrical light emitting elements LD having a size to a degree of the nanometer scale to the micrometer scale. However, the disclosure is not limited thereto, and various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device using various structures and/or driving methods.

Figure 4:
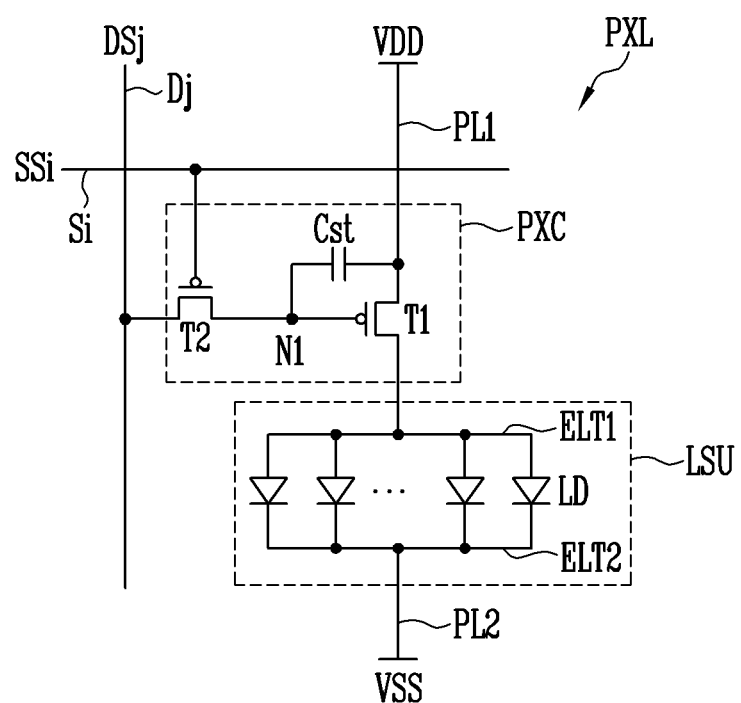
FIG. 4 to FIG. 6 schematically illustrate circuit diagrams of a pixel according to an embodiment.
Figure 5:
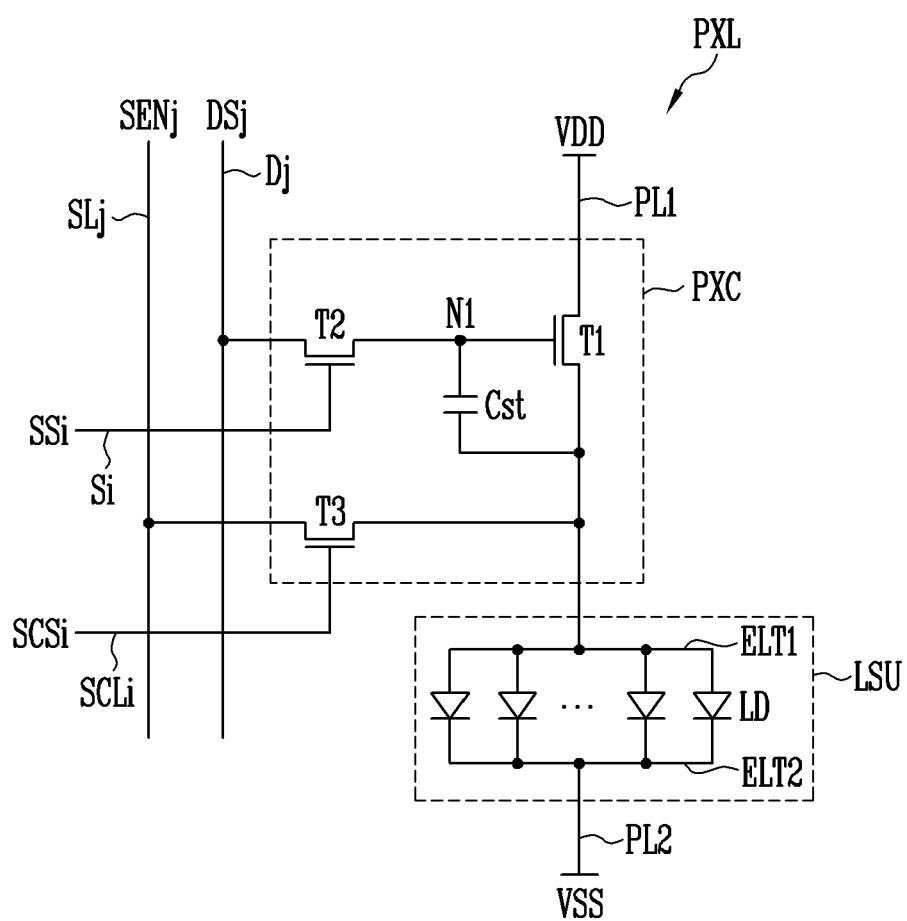
Figure 6:
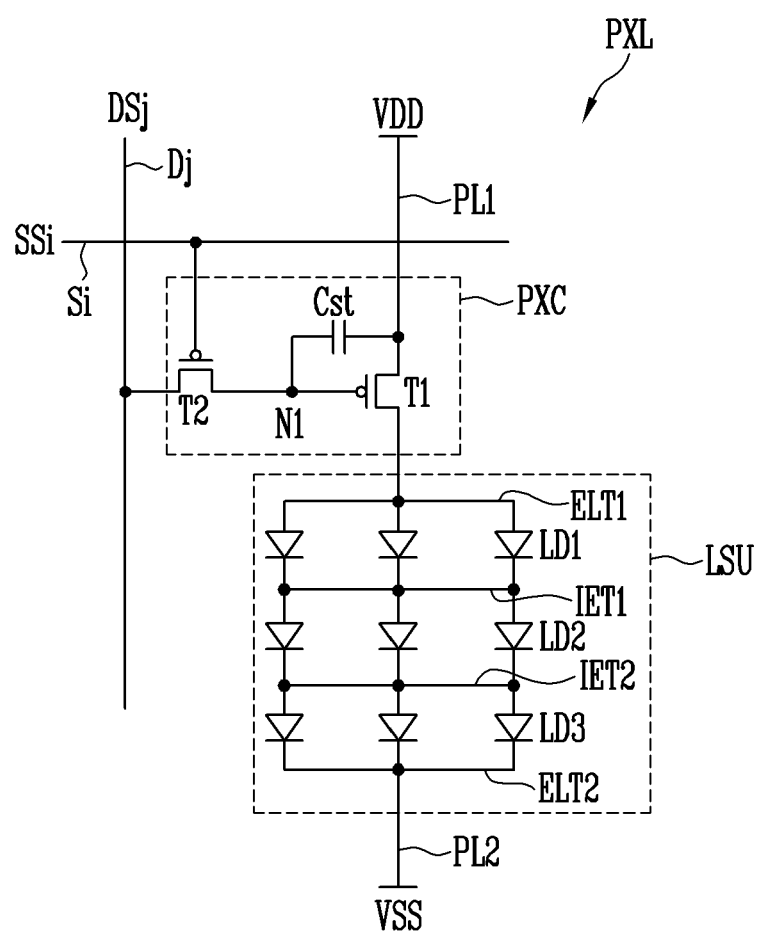

FIGS. 4 to 6 schematically illustrate a schematic diagram of an equivalent circuit of a pixel according to an embodiment. For example, FIGS. 4 to 6 illustrate an embodiment of the pixel PXL applicable to an active display device. However, the types of the pixel PXL and the display device are not limited thereto.

In some embodiments, the pixel PXL shown in FIGS. 4 to 6 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially an identical or similar structure.

Referring to FIG. 4, the pixel PXL may include a light source unit LSU for generating light at luminance corresponding to a data signal, and a pixel circuit PXC for driving a light source unit LSU.

The light source unit LSU may include at least one light emitting element electrically connected between a first power source VDD and a second power source VSS. For example, the light source unit LSU may include a first electrode ELT1 (also referred to as a "first pixel electrode" or "first alignment electrode") electrically connected to the first power VDD via the pixel circuit PXC and a first power line PL1, a second electrode ELT2 (also referred to as a "second pixel electrode" or "second alignment electrode") electrically connected to the second power VSS through a second power line PL2, and light emitting elements LD electrically connected in an identical direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a P-type end portion) electrically connected to the first power source VDD through the first electrode ELT1 and/or the pixel circuit PXC, and a second end portion (for example, an N-type end portion) electrically connected to the second power source VSS through the second electrode ELT2. For example, the light emitting elements LD may be electrically connected in parallel in a forward direction between the first and second electrodes ELT1 and ET2. Respective light emitting elements LD electrically connected in the forward direction between the first power source VDD and the second power source VSS may configure (or form) respective effective light sources, and these effective light sources may be combined to configure the light source unit LSU of the pixel PXL.

The first and second power sources VDD and VSS may have different potentials so that the light emitting elements LD may emit light. For example, the first power source VDD may be set as a high potential power source, and the second power source VSS may be set as a low potential power source. A potential difference between the first and second power source sources VDD and VSS may be set to be equal to or higher than a threshold voltage of the light emitting elements LD during at least a light emitting period of the pixel PXL.

First end portions (for example, P-type end portions) of the light emitting elements LD configuring each light source unit LSU may be commonly connected to the pixel circuit PXC through an electrode (for example, the first pixel electrode ET1 of each pixel PXL) of the light source unit LSU and may be electrically connected to the first power source VDD through the pixel circuit PXC and the first power line PL1. Second end portions (for example, N-type end portions) of the light emitting elements LD may be commonly and electrically connected to the second power source VSS through the other electrode (for example, the second electrode ELT2 of each pixel PXL) of the light source unit LSU and the second power line PL2.

The light emitting elements LD may emit light with luminance corresponding to a driving current supplied through the corresponding pixel circuit PXC. For example, during each frame period, the pixel circuit PXC may supply a driving current corresponding to a gray value to be displayed in the corresponding frame to the light source unit LSU. The driving current supplied to the light source unit LSU may be divided to flow in the light emitting elements LD that are electrically connected in a forward direction. Therefore, while each light emitting element LD emits light with a luminance corresponding to the current flowing therein, the light source unit LSU may emit light having a luminance corresponding to the driving current.

The pixel circuit PXC may be electrically connected between the first power source VDD and the first electrode ELT1. The pixel circuit PXC may be electrically connected to a scan line Si and a data line Dj of the pixel PXL. For example, in case that the pixel PXL is disposed in an i-th horizontal line (row) (where i is a natural number) and a j-th vertical line (column) (where j is a natural number) of the display area DA, the pixel circuit PXC may be electrically connected to an i-th scan line Si and a j-th data line Dj of the display area DA.

In some embodiments, the pixel circuit PXC may include transistors and at least one capacitor. For example, the pixel circuit PXC may include a first transistor T1, a second transistor T2, and a storage capacitor Cst.

The first transistor T1 may be electrically connected between the first power source VDD and the light source unit LSU. For example, a first electrode (for example, a source electrode) of the first transistor T1 may be electrically connected to the first power source VDD, and a second electrode (for example, a drain electrode) of the first transistor T1 may be electrically connected to the first electrode ELT1. A gate electrode of the first transistor T1 may be electrically connected to a first node N1. The first transistor T1 may control a driving current supplied to the light source unit LSU in response to a voltage of the first node N1. For example, the first transistor T1 may be a driving transistor that controls a driving current of the pixel PXL.

The second transistor T2 may be electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node 1. A gate electrode of the second transistor T2 may be electrically connected to the scan line Si. In case that a scan signal SSi of a gate-on voltage (for example, a low level voltage) may be supplied from the scan line Si to the second transistor T2, the second transistor T2 may be turned on to electrically connect the data line Dj and the first node N1.

For each frame period, a data signal DSj of the corresponding frame may be supplied to the data line Dj, and the data signal DSj may be transmitted to the first node N1 through the second transistor T2 turned on during a period in which the scan signal SSi of the gate-on voltage is supplied to the second transistor T2. For example, the second transistor T2 may be a switching transistor for transmitting each data signal DSj to the inside of the pixel PXL.

One electrode of the storage capacitor Cst may be electrically connected to the first power source VDD, and the other electrode thereof may be electrically connected to the first node N1. The storage capacitor Cst may be charged with a voltage the corresponding to the data signal DSj supplied to the first node N1 during each frame period.

In FIG. 4, the transistors included in the pixel circuit PXC, for example, the first and second transistors T1 and T2 are all illustrated as P-type transistors, but are not limited thereto, and a least one of the first and second transistors T1 and T2 may be changed to an N-type transistor. The pixel circuit PXC may be configured as a pixel circuit having various structures and/or driven by various driving methods.

Referring to FIG. 5, the pixel circuit PXC may be further electrically connected to a sensing control line SCLi and a sensing line SLj. For example, the pixel circuit PXC of the pixel PXL disposed at an i-th horizontal line and a j-th vertical line of the display area DA may be electrically connected to an i-th sensing control line SCLi and a j-th sensing line SLj of the display area DA. The pixel circuit PXC may further include a third transistor T3. As another example, the sensing line SLj may be omitted, and the characteristics of the pixel PXL may be detected by detecting a sensing signal SENj through the data line Dj of the corresponding pixel PXL (or an adjacent pixel).

The third transistor T3 may be electrically connected between the first transistor T1 and the sensing line SLj. For example, an electrode of the third transistor T3 may be electrically connected to an electrode (for example, a source electrode) of the first transistor T1 electrically connected to the first electrode ELT1, and the other electrode thereof may be electrically connected to the sensing line SLj. In case that the sensing line SLj is omitted, the other electrode of the third transistor T3 may also be electrically connected to the data line Dj.

A gate electrode of the third transistor T3 may be electrically connected to the sensing control line SCLi. In case that the sensing control line SCLi is omitted, the gate electrode of the third transistor T3 may be electrically connected to the scan line Si. The third transistor T3 may be turned on by a sensing control signal SCSi having a gate-on voltage (for example, a high level voltage) supplied to the sensing control line SCLi during a predetermined sensing period to electrically connect the sensing line SLj and the first transistor T1.

In some embodiments, the sensing period may be a period for extracting characteristics (for example, a threshold voltage of the first transistor T1) of each of the pixels PXL disposed in the display area DA. During the sensing period, the first transistor T1 may be turned on by supplying a predetermined reference voltage, at which the first transistor T1 may be turned on, to the first node N1 through the data line Dj and the second transistor T2 and by electrically connecting each pixel PXL to a current source or the like. By turning on the third transistor T3 by supplying the sensing control signal SCSi having a gate-on voltage to the third transistor, the first transistor T1 may be electrically connected to the sensing line SLj. Thereafter, the sensing signal SENj may be obtained through the sensing line SLj, and the characteristics of each pixel PXL including the threshold voltage or the like of the first transistor T1 may be detected by using the sensing signal SENj. Information on the characteristics of each pixel PXL may be used to convert image data so that a characteristic difference between the pixels PXL disposed in the display area DA may be compensated for.

FIG. 5 illustrates an embodiment in which the first, second, and third transistors T1, T2, and T3 are N-type transistors, but the disclosure is not limited thereto. For example, at least one of the first, second, and third transistors T1, T2, and T3 may be changed to a P-type transistor.

FIGS. 4 and 5 illustrate the embodiments in which effective light sources forming each light source unit LSU, for example, the light emitting elements LD, are electrically connected in parallel, but the disclosure is not limited thereto. For example, as shown in FIG. 6, the light source unit LSU of each pixel PXL may include at least two stages in series. In describing embodiments of FIG. 6, detailed descriptions of elements (for example, the pixel circuit PXC) that is similar or identical to those of the embodiments of FIGS. 4 and 5 will be omitted.

Referring to FIG. 6, the light source unit LSU may include at least two light emitting elements electrically connected in series to each other. For example, the light source unit LSU may include a first light emitting element LD1, a second light emitting element LD2, and a third light emitting element LD3 that are electrically connected between the first power source VDD and the second power source VSS in series in a forward direction. Each of the first, second, and third light emitting elements LD1, LD2, and LD3 may configure (or form) an effective light source.

Hereinafter, a specific light emitting element among the first, second, and third light emitting elements LD1, LD2, and LD3 may be referred to as a "first light emitting element LD1," "second light emitting element LD2," or "third light-emitting element LD3," respectively. At least one light emitting element among the first, second, and third light emitting elements LD1, LD2, and LD3, or the first, second, and third light emitting elements LD1, LD2, and LD3 may be referred to as "light emitting element LD" or "light emitting elements LD."

A first end portion (for example, a P-type end portion) of the first light emitting element LD1 may be electrically connected to the first power source VDD via the first electrode ELT1 (for example, first pixel electrode) of the light source unit LSU. A second end portion (for example, an N-type end portion) of the first light emitting element LD1 may be electrically connected to a first end portion (for example, a P-type end portion) of the second light emitting element LD2 through a first intermediate electrode IET1.

The first end portion of the second light emitting element LD2 may be electrically connected to a second end portion of the first light emitting element LD1. The second end portion (for example, an N-type end portion) of the second light emitting element LD2 may be electrically connected to a first end portion (for example, a P-type end portion) of the third light emitting element LD3 through a second intermediate electrode IET2.

The first end portion of the third light emitting element LD3 may be electrically connected to a second end portion of the second light emitting element LD2. A second end portion (for example, an N-type end portion) of the third light emitting element LD3 may be electrically connected to the second power supply VSS via the second electrode (for example, a second pixel electrode ELT2) of the light source unit LSU. In the above-described manner, the first, second, and third light emitting elements LD1, LD2, and LD3 may be sequentially and electrically connected in series between the first and second electrodes ELT1 and ELT2 of the light source unit LSU.

FIG. 6 illustrates the embodiment of connecting the light emitting elements LD in a three-stage serial structure, but the disclosure is not limited thereto, and two light emitting elements LD may be electrically connected in a two-stage serial structure, or four or more light emitting elements LD may be electrically connected in a series structure having four or more stages.

Assuming that the same luminance is expressed (or displayed) using the light-emitting elements LD of the same condition (for example, the same size and/or number), in the light source unit LSU having a structure in which the light emitting elements LD are electrically connected in series, a voltage applied between the first and second electrodes ELT1 and ELT2 may be greater, and a driving current flowing through the light source unit LSU may be smaller, than those in the light source unit LSU having a structure in which the light emitting elements LD are electrically connected in parallel. Therefore, in case that the light source unit LSU of each pixel PXL is configured in the serial structure, a panel current flowing through the display panel PNL may be reduced.

As in the above-described embodiment, each light source unit LSU may include light emitting elements LD electrically connected between the first and second power sources VDD and VSS in a forward direction to form each effective light source. The connection structure between the light emitting elements LD may be variously changed according to embodiments. For example, the light emitting elements LD may be electrically connected to each other only in series or parallel, or may be electrically connected in a series/parallel mixed structure.

Figure 7:
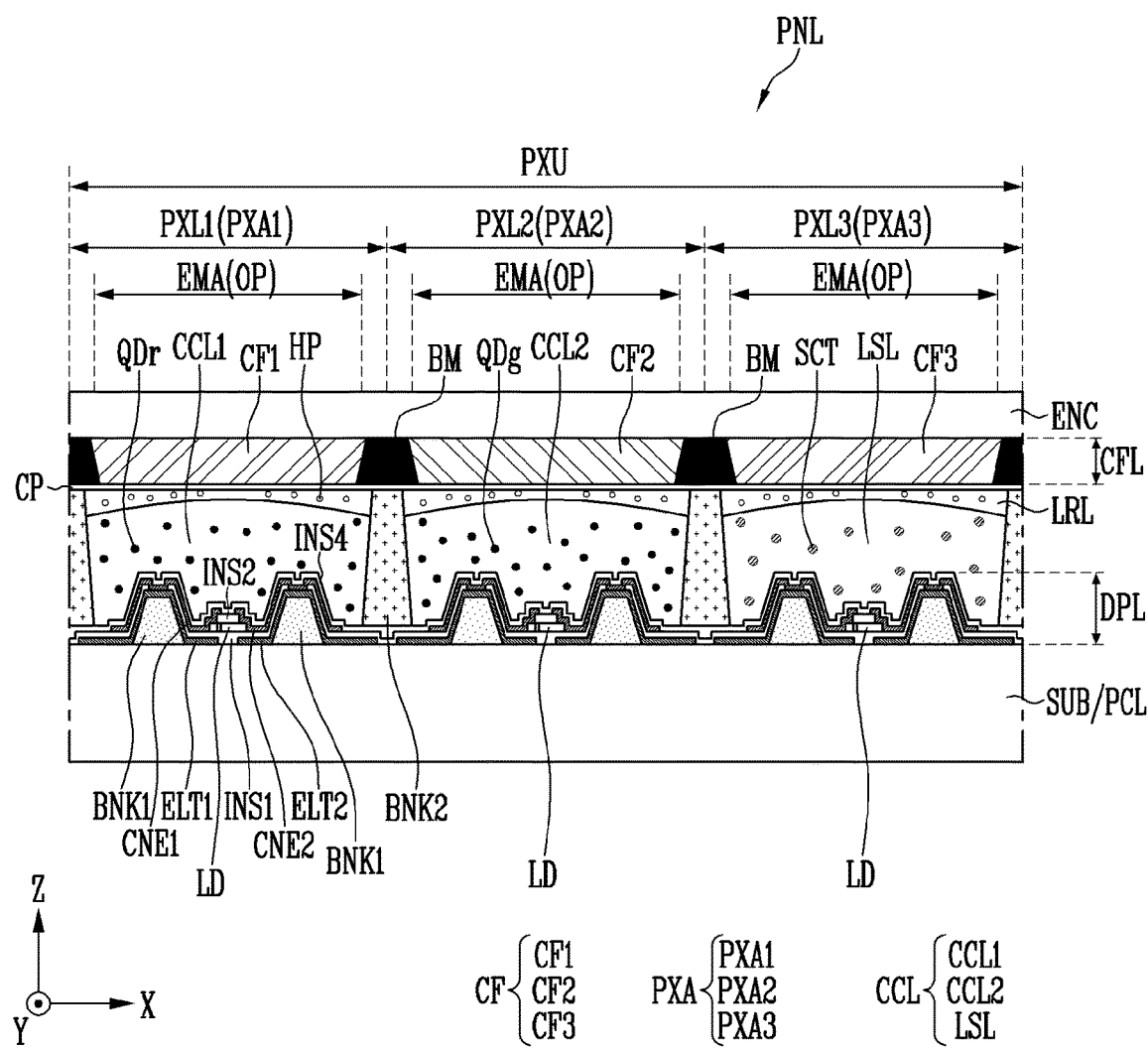
FIG. 7 schematically illustrates a cross-sectional view of a display device according to an embodiment.
Figure 8:
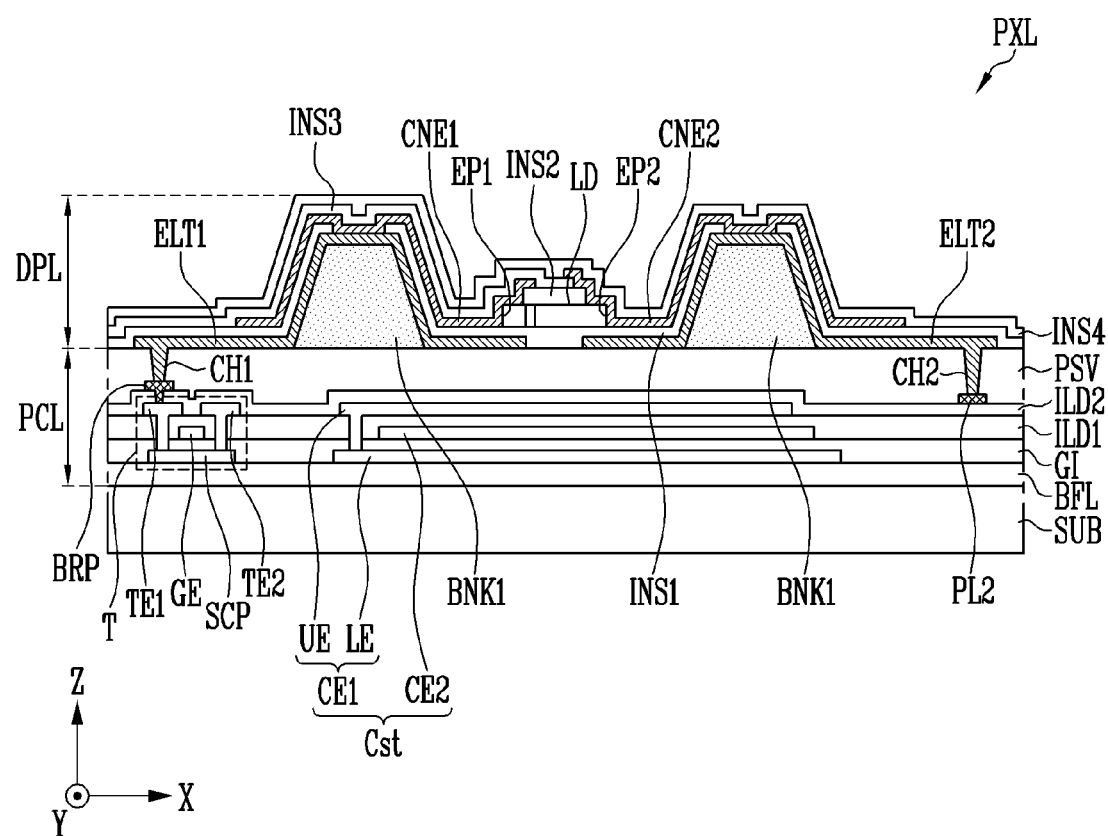
FIG. 8 and FIG. 9 schematically illustrate cross-sectional views of a pixel of FIG. 7.
Figure 9:
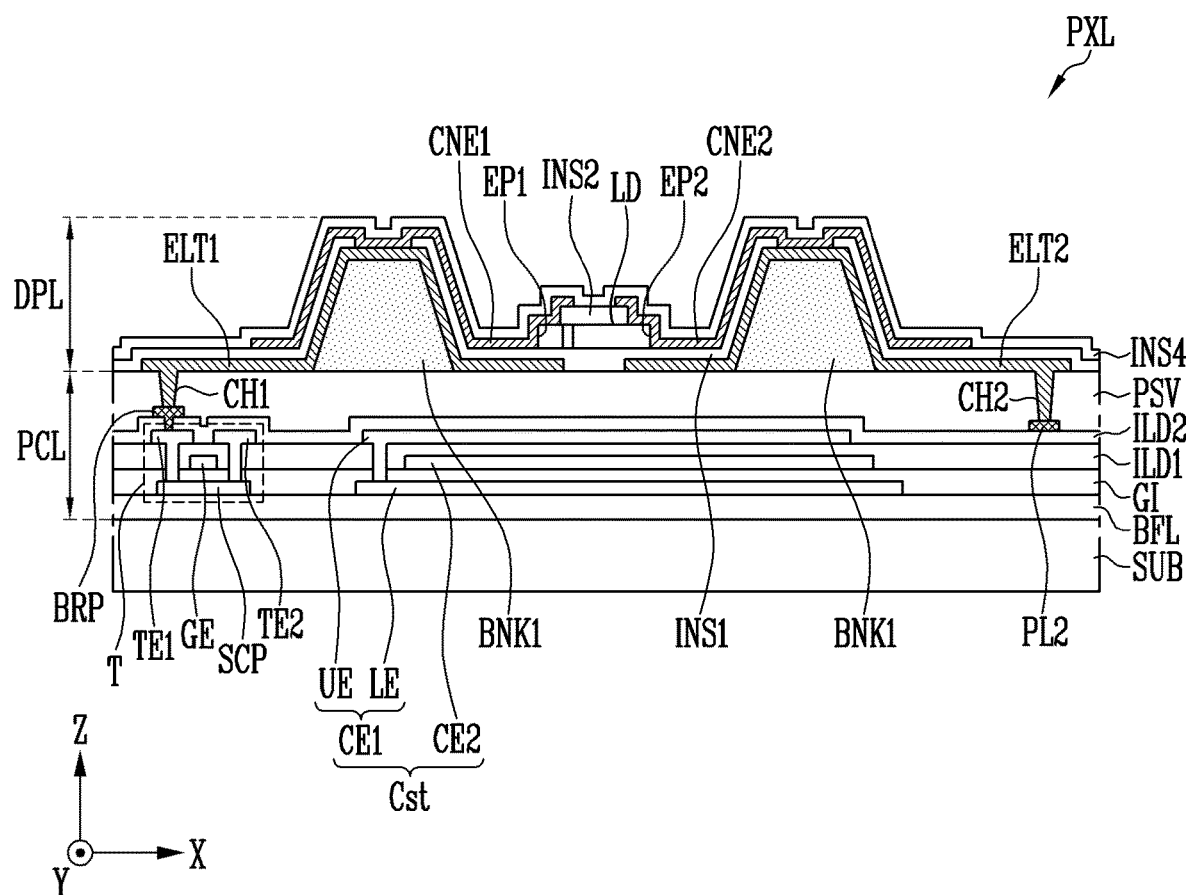
Figure 10:
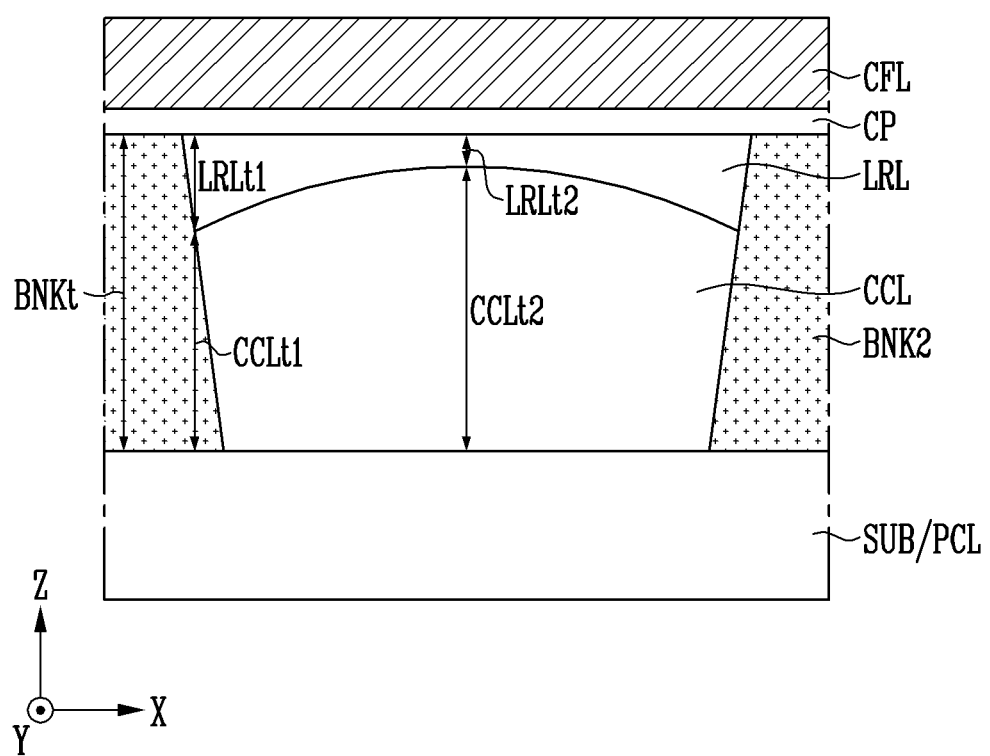
FIG. 10 schematically illustrates a schematic cross-sectional view of the color conversion layer and the low refractive layer of FIG. 7.

FIG. 7 illustrates a schematic cross-sectional view of a display device according to an embodiment. FIGS. 8 and 9 illustrate schematic cross-sectional views of a pixel of FIG. 7. FIG. 10 illustrates a schematic cross-sectional view of the color conversion layer and the low refractive layer of FIG. 7.

FIG. 7 illustrates a schematic cross-section of a display device, particularly, a display panel PNL provided in the display device, focusing on an area in which a pixel unit PXU including the first pixel PXL1, the second pixel PXL2, and the third pixel PXL3 adjacent to each other is disposed.

FIGS. 8 and 9 schematically illustrate the structure of each pixel PXL, focusing on a light emitting element LD and illustrate a transistor T (for example, the first transistor T1 in FIG. 4) and the storage capacitor Cst electrically connected to the first electrode ELT1 to illustrate various circuit elements configuring the pixel circuit PXC. Hereinafter, in case that it is not required to separately specify the first transistor T1, the first transistor T1 will be collectively referred to as a "transistor T."

Structures of the transistors T and the storage capacitor Cst and/or a position of each layer thereof are not limited to those in the embodiments shown in FIGS. 8 and 9 and may be variously changed according to embodiments. The transistors T forming each pixel circuit PXC may have substantially the same or similar structure. However, the disclosure is not limited thereto, and in some embodiments, at least one of the transistors T included in the pixel circuit PXC may have a different cross-sectional structure from the other transistors T and/or may be disposed on a different layer.

Referring to FIGS. 7 to 9, the pixel PXL and the display device including the same may include a substrate SUB, and a circuit layer PCL, a display layer DPL, a color conversion layer CCL, a low refractive layer LRL, and a color filter layer CFL that are disposed on a surface of the substrate SUB.

The circuit layer PCL may include circuit elements for forming the pixel circuit PXC of each pixel PXL, and various lines electrically connected to the circuit elements. The display layer DPL may include electrodes (for example, the first and second electrodes ELT1 and ELT2 and/or first and second contact electrodes CNE1 and CNE2) and the light emitting elements LD for configuring (or forming) the light source unit LSU of each pixel PXL.

The circuit layer PCL may include at least one circuit element electrically connected to the light emitting elements LD of each pixel PXL. For example, the circuit layer PCL may include transistors T and a storage capacitor Cst that are disposed in each pixel area PXA to form a pixel circuit PXC of a corresponding pixel PXL. The circuit layer PCL may further include at least one power line and/or signal line electrically connected to each pixel circuit PXC and/or light source unit LSU. For example, the circuit layer PCL may include the first power line PL1, the second power line PL2, and the scan line Si and the data line Dj of each pixel PXL. In case that the pixel circuit PXC is omitted and the light source unit LSU of each pixel PXL is directly connected to the first and second power lines PL1 and PL2 (or signal lines), the circuit layer PCL may be omitted.

The circuit layer PCL may include insulation layers. For example, the circuit layer PCL may include a buffer layer BFL, a gate insulation layer GI, a first interlayer insulation layer ILD1, a second interlayer insulation layer ILD2, and/or a passivation layer PSV, sequentially stacked on a surface of the substrate SUB. The circuit layer PCL may selectively further include at least one light blocking pattern (not shown) or the like disposed under at least some of the transistors T.

The buffer layer BFL may prevent impurities from diffusing into each circuit element. The buffer layer BFL may be formed as a single layer but may also be formed as a multi-layer of at least two layers. In case that the buffer layer BFL is provided as a multi-layer, the respective layers may be made of the same material or different materials. Various circuit elements such as the transistors T and the storage capacitor Cst, and various lines electrically connected to the circuit elements may be disposed on the buffer layer BFL. In some embodiments, the buffer layer BFL may be omitted. At least one circuit element and/or line may be disposed on a surface of the substrate SUB and directly contacts the surface of the substrate SUB.

Each transistor T may include a semiconductor pattern SCP (also referred to as a "semiconductor layer" or "active layer"), a gate electrode GE, first and second transistor electrodes TE1 and TE2. FIGS. 8 and 9 schematically illustrate the embodiment in which each transistor T includes the first and second transistor electrodes TE1 and TE2 formed separately from the semiconductor pattern SCP, but the disclosure is not limited thereto. For example, in another embodiment, the first and/or second transistor electrodes TE1 and/or TE2 provided in at least one transistor T may be integral with each semiconductor pattern SCP.

The semiconductor pattern SCP may be disposed on the buffer layer BFL. For example, the semiconductor pattern SCP may be disposed between the substrate SUB on which the buffer layer BFL is formed and the gate insulation layer GI. The semiconductor pattern SCP may include a first region electrically contacting each first transistor electrode TE1, a second region electrically contacting each second transistor electrode TE2, and a channel region disposed between the first and second regions. In some embodiments, one of the first and second regions may be a source region, and the other thereof may be a drain region.

In some embodiments, the semiconductor pattern SCP may be a semiconductor pattern made of polysilicon, amorphous silicon, an oxide semiconductor, or the like. The channel region of the semiconductor pattern SCP may be an intrinsic semiconductor as a semiconductor pattern that is not doped with impurities, and each of the first and second regions of the semiconductor pattern SCP may be a semiconductor pattern doped with impurities.

In an embodiment, the semiconductor patterns SCP of the transistors T included in each pixel circuit PXC may be made of substantially the same or similar material. For example, the semiconductor pattern SCP of the transistors T may be of at least one of polysilicon, amorphous silicon, and an oxide semiconductor.

In another embodiment, some of the transistors T and others thereof may include the semiconductor patterns SCP made of different materials. For example, the semiconductor pattern SCP of some of the transistors T may be made of polysilicon or amorphous silicon, and the semiconductor pattern SCP of others of the transistors T may be made of an oxide semiconductor.

The gate insulation layer GI may be disposed on the semiconductor pattern SCP. For example, the gate insulation layer GI may be disposed between the semiconductor pattern SCP and the gate electrode GE. The gate insulation layer GI may be formed as a single layer or multi-layer and may include various types of organic or inorganic insulating materials, e.g., a silicon nitride ($SiN_x$), a silicon oxide ($SiO_x$), or a silicon oxynitride ($SiO_xN_y$).

The gate electrode GE may be disposed on the gate insulation layer GI. For example, the gate electrode GE may be disposed to overlap the semiconductor pattern SCP with the gate insulation layer GI interposed therebetween. FIGS. 8 and 9 schematically illustrate a transistor T having a top-gate structure, but in another embodiment, the transistor T may have a bottom-gate structure. The gate electrode GE may be disposed under the semiconductor pattern SCP to overlap the semiconductor pattern SCP.

The first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be formed as a single layer or multi-layer and may include at least one inorganic insulating material and/or organic insulating material. For example, the first interlayer insulation layer ILD1 may include various types of organic or inorganic insulating materials, e.g., a silicon nitride ($SiN_x$), a silicon oxide ($SiO_x$), or a silicon oxynitride ($SiO_xN_y$), and the materials included in the first interlayer insulation layer ILD1 are not particularly limited.

The first and second transistor electrodes TE1 and TE2 may be disposed on each semiconductor pattern SCP with at least one first interlayer insulation layer ILD1 therebetween. For example, the first and second transistor electrodes TE1 and TE2 may be disposed on different end portions of the semiconductor pattern SCP with the gate insulation layer GI and the first interlayer insulation layer ILD1 therebetween. The first and second transistor electrodes TE1 and TE2 may be electrically connected to each semiconductor pattern SCP. For example, the first and second transistor electrodes TE1 and TE2 may be electrically connected to the first and second regions of the semiconductor pattern SCP through respective contact holes passing through the gate insulation layer GI and the first interlayer insulation layer ILD1. In some embodiments, one of the first and second transistor electrodes TE1 and TE2 may be a source electrode, and the other thereof may be a drain electrode.

At least one transistor T provided in the pixel circuit PXC may be electrically connected to at least one pixel electrode. For example, the transistor T may be electrically connected to the first electrode ELT1 of the corresponding pixel PXL through a contact hole (for example, first contact hole CH1) and/or a bridge pattern BRP passing through the passivation layer PSV.

The storage capacitor Cst may include a first capacitor electrode CE1 and a second capacitor electrode CE2 overlapping each other. Each of the first and second capacitor electrodes CE1 and CE2 may be formed as a single layer or multiple layers. At least one of the first and second capacitor electrodes CE1 and CE2 and at least one electrode or the semiconductor pattern SCP forming the first transistor T1 may be disposed on a same layer.

For example, the first capacitor electrode CE1 may be configured as a multilayer electrode that includes a lower electrode LE disposed on the same layer as the semiconductor pattern SCP of the first transistor T1, and an upper electrode UE disposed on the same layer as the first and second transistor electrodes TE1 and TE2 of the first transistor T1 and electrically connected to the lower electrode LE. The second capacitor electrode CE2 may be configured as a single layer electrode. The second capacitor electrode CE2 and the gate electrode of the first transistor T1 may be disposed on the same layer and may be disposed between the lower electrode LE and the upper electrode UE of the first capacitor electrode CE1. However, the structure and/or position of each of the first and second capacitor electrodes CE1 and CE2 may be variously changed. For example, one of the first and second capacitor electrodes CE1 and CE2 may include a conductive pattern. The conductive pattern and the electrodes (for example, the gate electrode GE and the first and second transistor electrodes TE1 and TE2) and the semiconductor pattern SCL that configure the first transistor T1 may be disposed on different layers. For example, the first capacitor electrode CE1 or the second capacitor electrode CE2 may have a single-layered or multi-layered structure including a conductive pattern disposed on the second interlayer insulation layer ILD2.

In an embodiment, at least one signal line and/or power line electrically connected to each pixel PXL and an electrode of circuit elements forming the pixel circuit PXC may be disposed on a same layer. For example, the scan line Si of each pixel PXL and the gate electrodes GE of transistors T may be disposed on the same layer, and the data line Dj of each pixel PXL and the first and second transistor electrodes TE1 and TE2 of transistors T may be disposed on a same layer.

The first and/or second power lines PL1 and PL2 and the gate electrodes GE or first and second transistor electrodes TE1 and TE2 of the transistors T may be disposed on a same layer or different layers. For example, the second power line PL2 for supplying the second power source VSS may be disposed on the second interlayer insulation layer ILD2 to be at least partially covered by the passivation layer PSV. The second power line PL2 may be electrically connected to the second electrode ELT2 of the light source unit LSU disposed on the passivation layer PSV through a second contact hole CH2 passing through the passivation layer PSV. However, the position and/or structure of the first and/or second power lines PL1 and PL2 may be variously changed. For example, the second power line PL2 and the gate electrodes GE of the transistors T or the first and second transistor electrodes TE1 and TE2 may be disposed on a same layer to be electrically connected to the second electrode ELT2 through at least one bridge pattern (not shown) and/or the second contact hole CH2.

The second interlayer insulation layer ILD2 may be disposed on the first interlayer insulation layer ILD1 and may cover or overlap the first and second transistor electrodes TE1 and TE2 and/or storage capacitor Cst disposed on the first interlayer insulation layer ILD1. The second interlayer insulation layer ILD2 may be formed as a single layer or multi-layer and may include at least one inorganic insulating material and/or organic insulating material. For example, the second interlayer insulation layer ILD2 may include various types of organic/inorganic insulating materials, e.g., a silicon nitride ($SiN_x$), a silicon oxide ($SiO_x$), or a silicon oxynitride ($SiO_xN_y$), but the material of the second interlayer insulation layer ILD2 is not particularly limited thereto.

The bridge pattern BRP, the first power wire PL1, and/or the second Power wire PL2 for electrically connecting at least one circuit element (for example, the first transistor T1) provided in the pixel circuit PXC to the first electrode ELT1 may be disposed on the second interlayer insulation layer ILD2.

The passivation layer PSV may be disposed on the circuit elements including the transistors T and the storage capacitor Cst and/or on the lines including the first and second power lines PL1 and PL2. The passivation layer PSV may be formed as a single layer or multi-layer and may include at least one inorganic insulating material and/or organic insulating material. For example, the passivation layer PSV may include at least one organic insulation layer and may function to substantially flatten a surface of the circuit layer PCL.

The display layer DPL may be disposed on the passivation layer PSV of the circuit layer PCL. The display layer DPL may include at least one of first electrodes ELT1 and at least one of second electrode ELT2 disposed in the light emitting area EMA of each pixel PXL and configuring each light source unit LSU, and at least one light emitting element LD electrically connected between the first electrode ELT1 and the second electrode ELT2. FIGS. 7 to 9 schematically illustrate a light emitting element LD disposed in each pixel PXL, but each pixel PXL may include light emitting elements LD electrically connected between the first and second electrodes ELT1 and ELT2 as in the embodiment of FIG. 4. Accordingly, hereinafter, assuming that the pixel PXL includes light emitting elements LD, each embodiment will be described.

The display layer DPL may further include the first and second contact electrodes CNE1 and CNE2 for more stably connecting the light emitting elements LD between the first and second electrodes ELT1 and ELT2 and a first bank BNK1 for protruding an area of each of the first and second electrodes ELT1 and ELT2 and/or the first and second contact electrodes CNE1 and CNE2 in an upper direction, for example, a third direction (Z-axis direction). The display layer DPL may further include at least one conductive layer and/or an insulation layer.

The first bank BNK1 may be disposed on the circuit layer PCL. The first banks BNK1 may be formed in a separate or integral pattern. The first bank BNK1 may protrude in a height direction of the substrate SUB, for example, a third direction (Z-axis direction).

The first bank BNK1 may have various shapes according to embodiments. In an embodiment, the first bank BNK1 may be a bank structure having a positively tapered structure. For example, the first bank BNK1 may have an inclined surface inclined at a predetermined angle with respect to the substrate SUB as shown in FIGS. 7 to 9. However, the disclosure is not limited thereto, and the first bank BNK1 may have a side wall having a curved surface or a stepped shape. For example, the first bank BNK1 may have a cross-section of a semicircular or semielliptical shape.

Electrodes and insulation layers disposed on the first bank BNK1 may have a shape corresponding to that of the first bank BNK1. For example, the first and second electrodes ELT1 and ELT2 and the first and second contact electrodes CNE1 and CNE2 may be disposed on an area of the first bank BNK1 and may include an inclined or curved surface having a shape corresponding to that of the first bank BNK1. Likewise, first, third, and/or fourth insulation layers INS1, INS3, and INS4 may be disposed on the first bank BNK1 to include an inclined or curved surface having a shape corresponding to that of the first bank BNK1.

The first bank BNK1 may contain an insulating material including at least one inorganic material and/or an organic material. For example, the first bank BNK1 may include at least one layer of inorganic film that includes various inorganic insulating materials including a silicon nitride ($SiN_x$) or a silicon oxide ($SiO_x$). As another example, the first bank BNK1 may include an organic film and/or a photoresist film that includes various organic insulating materials or may include a single-layered or multi-layered insulator including organic/inorganic materials. For example, the material and/or pattern shape of the first bank BNK1 may be variously changed.

In an embodiment, the first bank BNK1 may function as a reflective member. For example, the first bank BNK1 may function as a reflective member that guides the light emitted by each light emitting element LD in an upward direction of the pixel PXL, for example, a third direction (Z-axis direction), along with the first and second electrodes ELT1 and ELT2 provided on the first bank BNK1, to improve the light efficiency of the pixel PXL.

The first and second electrodes ELT1 and ELT2 forming the pixel electrodes of each pixel PXL may be disposed on the first bank BNK1. The first electrode ELT1 and the second electrode ELT2 may be disposed in each pixel area PXA in which each PXL is provided and/or formed. For example, the first electrode ELT1 and the second electrode ELT2 may be disposed in the light emitting area EMA of each pixel PXL. The first and second electrodes ELT1 and ELT2 may be spaced apart from each other. For example, the first and second electrodes ELT1 and ELT2 may be disposed alongside each other in each light emitting area EMA to be spaced apart from each other by a predetermined interval.

In some embodiments, the first and/or second electrodes ELT1 and ELT2 may have a pattern separated for each pixel PXL or a pattern commonly electrically connected to pixels PXL. Before the process of forming the pixel PXL, particularly, before the alignment of the light emitting elements LD is completed, the first electrodes ELT1 of the pixels PXL disposed in the display area DA may be electrically connected to each other, and the second electrodes ELT2 of the pixels PXL may be electrically connected to each other. For example, before the alignment of the light emitting elements LD is completed, the first electrodes ELT1 of the pixels PXL may be formed integrally or non-integrally with each other and may be electrically connected to each other, and the second electrodes ELT2 of the pixels PXL may be formed integrally or non-integrally with each other and may be electrically connected to each other. In case that the first electrodes ELT1 or the second electrodes ELT2 of the pixels PXL are non-integrally electrically connected to each other, the first electrodes ELT1 or the second electrodes ELT2 may be electrically connected to each other by at least one contact hole and/or bridge pattern.

The first and second electrodes ELT1 and ELT2 may receive a first alignment signal (or a first alignment voltage) and a second alignment signal (or a second alignment voltage) in an alignment step of the light emitting elements LD. For example, one of the first and second electrodes ELT1 and ELT2 may be supplied with an AC-type alignment signal, and the other of the first and second electrodes ELT1 and ELT2 may be supplied with an alignment voltage (for example, a ground voltage) having a predetermined voltage level. For example, a predetermined alignment signal may be applied to the first and second electrodes ELT1 and ELT2 in the alignment step of the light emitting elements LD. Accordingly, an electric field may be formed between the first and second electrodes ELT1 and ELT2. The light emitting elements LD provided in each pixel area (particularly, the light emitting area EMA of each pixel PXL) may be self-aligned between the first and second electrodes ELT1 and ELT2 by the electric field. After the alignment of the light emitting elements LD is completed, the at least first electrodes ELT1 between the pixels PXL may be electrically disconnected from each other, and thus the pixels PXL may be individually driven.

The first electrode ELT1 may be electrically connected to a circuit element (for example, at least one transistor configuring the pixel circuit PXC), a power line (for example, the first power line PL1), and/or a signal line (for example, the scan line Si, the data line Dj, or a control line) through a first contact hole CH1. In an embodiment, the first electrode ELT1 may be electrically connected to the bridge pattern BRP through the first contact hole CH1, and thus, may be electrically connected to the transistor T. However, the disclosure is not limited thereto, and the first electrode ELT1 may be directly connected to a power line or a signal line.

The second electrode ELT2 may be electrically connected to a circuit element (for example, at least one transistor forming the pixel circuit PXC), a power line (or line) (for example, the second power line PL2), and/or a signal line (for example, the scan line Si, the data line Dj, or a control line) through a second contact hole CH2. In an embodiment, the second electrode ELT2 may be electrically connected to the second power line PL2 through the second contact hole CH2. However, the disclosure is not limited thereto, and the second electrode ELT2 may be directly connected to a power line or signal line.

Each of the first and second electrodes ELT1 and ELT2 may contain at least one conductive material. For example, each of the first and second electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including at least one among them; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO) and a conductive polymer such as poly(3,4-ethylenedioxythiophene) (PEDOT), but the disclosure is not limited thereto. For example, each of the first and second electrodes ELT1 and ELT2 may contain other conductive materials including a carbon nanotube or graphene. Each of the first and second electrodes ELT1 and ELT2 may be configured of (or formed of) a single layer or multi-layer. For example, each of the first and second electrodes ELT1 and ELT2 may include a reflective electrode layer containing a reflective conductive material. Each of the first and second electrodes ELT1 and ELT2 may selectively further include at least one of at least one transparent electrode layer disposed on and/or below the reflective electrode layer and at least one conductive capping layer covering or overlapping the reflective electrode layer and/or the transparent electrode layer.

The first insulation layer INS1 may be disposed on areas of the first and second electrodes ELT1 and ELT2. For example, the first insulation layer INS1 may cover or overlap an area of each of the first and second electrodes ELT1 and ELT2 and may include an opening exposing another area of each of the first and second electrodes ELT1 and ELT2. For example, the first insulation layer INS1 may include an opening formed in an upper surface of the first bank BNK1. In the area in which the first insulation layer INS1 is opened, the first and second electrodes ELT1 and ELT2 may be electrically connected to the first and second contact electrodes CNE1 and CNE2, respectively. In some embodiments, the first insulation layer INS1 may be omitted. The light emitting elements LD may be disposed on the passivation layer PSV and/or an end of each of first and second electrodes ELT1 and ELT2 and directly contact the passivation layer PSC and/or the end of each of the first and second electrodes ELT1 and ELT2.

In an embodiment, the first insulation layer INS1 may be first formed to entirely cover or overlap the first and second electrodes ELT1 and ELT2. After the light emitting elements LD are supplied and arranged on the first insulation layer INS1, the first insulation layer INS1 may be partially opened to expose areas of the first and second electrodes ELT1 and ELT2. For example, the first insulation layer INS1 may include an opening exposing areas of the first and second electrodes ELT1 and ELT2, in an upper surface of the first bank BNK1 and may at least partially overlap the inclined or curved surfaces of the first and second electrodes ELT1 and ELT2. As another example, the first insulation layer INS1 may be patterned in the form of an individual pattern that is locally formed only under the light emitting elements LD after the light emitting elements LD are completely supplied and arranged. The first insulation layer INS1 may overlap the first and second electrodes ELT1 and ELT2 after the first and second electrodes ELT1 and ELT2 are formed. Accordingly, it is possible to prevent the first and second electrodes ELT1 and ELT2 from being damaged in a subsequent process.

The first insulation layer INS1 may be formed as a single layer or multi-layer and may include at least one inorganic insulating material and/or organic insulating material. For example, the first insulation layer INS1 may include various types of organic/inorganic insulating materials including a silicon nitride ($SiN_x$), a silicon oxide ($SiO_x$), a silicon oxynitride ($SiO_xN_y$), or an aluminum oxide ($AlO_x$).

The light emitting elements LD may be provided and arranged on the first and second electrodes ELT1 and ELT2 and the first insulation layer INS1. The light emitting elements LD may be supplied to each pixel area PXA, in which the first bank BNK1, the first and second electrodes ELT1 and ELT2, the first insulation layer INS1, and the like are formed, and may be arranged between the first and second electrodes ELT1 and ELT2. For example, light emitting elements LD may be supplied to the light emitting area EMA of each pixel PXL by an inkjet method, a slit coating method, or various other methods, and the light emitting elements LD may be aligned between the first and second electrodes ELT1 and ELT2 in a direction by a predetermined alignment signal (or an alignment voltage) applied to each of the first and second electrodes ELT1 and ELT2.

In an embodiment, at least some of the light emitting elements LD may be disposed between a first electrode and a second electrode ELT1 and ELT2 so that both end portions thereof (for example, the first and second end portions EP1 and EP2) overlap the first and second electrodes ELT1 and ELT2, respectively. In another embodiment, at least some of the light emitting elements LD may be disposed not to overlap the first and/or second electrodes ELT1 and ELT2 between the first and second electrodes ELT1 and ELT2 and may be electrically connected to the first and second electrodes ELT1 and ELT2 through the first and second contact electrodes CNE1 and CNE2, respectively. Each light emitting element LD electrically connected between the first and second electrodes ELT1 and ELT2 may form an effective light source of the corresponding pixel PXL. The effective light sources may configure the light source unit LSU of the corresponding pixel PXL.

The second insulation layer INS2 may be disposed on an area of the light emitting elements LD. For example, the second insulation layer INS2 may be disposed on an area of each of the light emitting elements LD to expose the first and second end portions EP1 and EP2 of each of the light emitting elements LD. For example, the second insulation layer INS2 may be locally disposed on an area including a central area of each of the light emitting elements LD. In case that the second insulation layer INS2 is formed on the light emitting elements LD after the alignment of the light emitting elements LD is completed, it is possible to prevent the light emitting elements LD from deviating from an aligned position.

The second insulation layer INS2 may be formed in an independent pattern in the light emitting area EMA of each pixel PXL, but the disclosure is not limited thereto. In some embodiments, the second insulation layer INS2 may be omitted, and an end of each of the first and second contact electrodes CNE1 and CNE2 may be disposed on the upper surface of the light emitting elements LD and directly contact the upper surface of the light emitting elements LD.

The second insulation layer INS2 may be formed as a single layer or multi-layer and may include at least one inorganic insulating material and/or organic insulating material. For example, the second insulation layer INS2 may include various types of organic/inorganic insulating materials, e.g., a silicon nitride ($SiN_x$), a silicon oxide ($SiO_x$), an aluminum oxide ($AlO_x$), a photoresist material.

Both end portions of the light emitting elements LD that are not overlapped by the second insulation layer INS2, for example, the first and second end portions EP1 and EP2, may be overlapped by the first and second contact electrodes CNE1 and CNE2, respectively. The first and second contact electrodes CNE1 and CNE1 may be spaced apart from each other. For example, the adjacent first and second contact electrodes CNE1 and CNE2 may be disposed on the first and second end portions EP1 and EP2 of at least one adjacent light emitting element LD to be spaced apart from each other with the second insulation layer INS2 therebetween.

The first and second contact electrodes CNE1 and CNE2 may be disposed on the first and second electrodes ELT1 and ELT2 to overlap the exposed area of each of the first and second electrodes ELT1 and ELT2. For example, the first and second contact electrodes CNE1 and CNE2 may be disposed on at least one area of each of the first and second electrodes ELT1 and ELT2 so as to directly or indirectly contact each of the first and second electrodes ELT1 and ELT2 on or around the first bank BNK1. Accordingly, the first and second contact electrodes CNE1 and CNE2 may be electrically connected to the first and second electrodes ELT1 and ELT2, respectively. For example, each of the first and second electrodes ELT1 and ELT2 may be electrically connected to the first or second end portions EP1 and EP2 of at least one light emitting element LD adjacent thereto through the first and second contact electrodes CNE1 and CNE2.

In an embodiment, the first and second contact electrodes CNE1 and CNE2 may be sequentially formed in different layers on a surface of the substrate SUB as shown in FIG. 8. The third insulation layer INS3 may be disposed between the first contact electrode CNE1 and the second contact electrode CNE2. The order of formation of the first and second contact electrodes CNE1 and CNE2 may vary according to embodiments. For example, in some embodiments, before the first contact electrode CNE1 is formed, the second contact electrode CNE2 may be first formed, and the third insulation layer INS3 may be formed to overlap the second contact electrode CNE2 and the second insulation layer INS2, and then the first contact electrode CNE1 may be formed on the third insulation layer INS3. However, the disclosure is not limited thereto, and the first and second contact electrodes CNE1 and CNE2 may be disposed on the same layer as shown in FIG. 9. For example, the first and second contact electrodes CNE1 and CNE2 may be formed of a same conductive layer on a surface of the substrate SUB. Since the first and second contact electrodes CNE1 and CNE2 may be simultaneously formed by the same process, a manufacturing process of the display device may be simplified. However, the disclosure is not limited thereto, and the first and second contact electrodes CNE1 and CNE2 may be sequentially formed.

The first and second contact electrodes CNE1 and CNE2 may be made of various transparent conductive materials. For example, the first and second contact electrodes CNE1 and CNE2 may include at least one of various transparent conductive materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be substantially transparent or translucent to satisfy a predetermined transmittance. Accordingly, the light emitted from the light emitting elements LD through each of the first and second end portions EP1 and EP2 may pass through the first and second contact electrodes CNE1 and CNE2 to be emitted to the outside of the display panel PNL.

The third insulation layer INS3 may be disposed between the first contact electrode CNE1 and the second contact electrode CNE2. As such, in case that the third insulation layer INS3 is formed between the first contact electrode CNE1 and the second contact electrode CNE2, it is possible to secure electrical stability between the first and second end portions EP1 and EP2 of the light emitting elements LD. For example, the first and second contact electrodes CNE1 and CNE2 may be stably separated by the third insulation layer INS3. Accordingly, it is possible to effectively prevent a short circuit defect from occurring between the first and second end portions EP1 and EP2 of the light emitting elements LD.

The third insulation layer INS3 may be formed as a single layer or multiple layers and may include at least one inorganic insulating material and/or organic insulating material. For example, the third insulation layer INS3 may include various types of organic/inorganic insulating materials, e.g., a silicon nitride ($SiN_x$), a silicon oxide ($SiO_x$), a silicon oxynitride ($SiO_xN_y$), or an aluminum oxide ($AlO_x$).

A fourth insulation layer INS4 may be disposed on the first and second contact electrodes CNE1 and CNE2 and/or the third insulation layer INS3. For example, the fourth insulation layer INS4 may overlap the first banks BNK1, the first and second electrodes ELT1 and ELT2, the first, second, and/or third insulation layers INS1, INS2, and/or INS3, the light emitting elements LD, and the first and second contact electrodes CNE1 and CNE2. The fourth insulation layer INS4 may include at least one inorganic layer and/or at least one organic layer.

The fourth insulation layer INS4 may be formed as a single layer or multi-layer and may include at least one inorganic insulating material and/or organic insulating material. For example, the fourth insulation layer INS4 may include various types of organic/inorganic insulating materials, e.g., a silicon nitride ($SiN_x$), a silicon oxide ($SiO_x$), a silicon oxynitride ($SiO_xN_y$), or an aluminum oxide ($AlO_x$).

In an embodiment, the fourth insulation layer INS4 may include a thin film encapsulation layer having a multi-layered structure. For example, the fourth insulation layer INS4 may include a thin film encapsulation layer having a multi-layered structure that includes at least two inorganic insulation layers and at least one organic insulation layer interposed between the at least two inorganic insulation layers. However, the disclosure is not limited thereto, and the material and/or structure of the fourth insulation layer INS4 may be variously changed.

A second bank BNK2, a color conversion layer CCL, and a low refractive layer LRL may be disposed on the display layer DPL. The color conversion layer CCL and the low refractive layer LRL may be disposed in an area partitioned by the second bank BNK2.

The second bank BNK2 may surround the light emitting areas EMA of the pixels PXL. For example, the second bank BNK2 may be disposed in a boundary area of each pixel area PXA in which the pixel PXL is provided and/or in an area between adjacent pixels PXL. Hereinafter, an arbitrary pixel area among the first, second, and third pixel areas PXA1, PXA2, and PXA3, or collectively two or more thereof may be referred to as "pixel area PXA" or "pixel areas PXA".

The second bank BNK2 may include an opening OP defining each of the light emitting areas EMA of the pixels PXL. The color conversion layer CCL and the low refractive layer LRL may be disposed in the opening OP of the second bank BNK2. Each light emitting area EMA may be partitioned by the opening OP of the second bank BNK2, so that the color conversion layer CCL and the low refractive layer LRL may be supplied to the light emitting area EMA. For example, in a step of forming the color conversion layer CCL and the low refractive layer LRL, which will be described below, the second bank BNK2 may function as a dam structure defining each light emitting area EMA to which the color conversion layer CCL and the low refractive layer LRL are to be supplied.

The second bank BNK2 may include at least one organic and/or inorganic material. As an example, the first bank BNK1 may include an organic film and/or a photoresist film including various types of organic insulation materials and formed as at least one layer. The second bank BNK2 may include an inorganic film including various inorganic insulation materials including a silicon nitride ($SiN_x$) or silicon oxide ($SiO_x$) and formed as at least one layer, or an insulator including organic or inorganic materials and formed as a single layer or multiple layers. For example, the material and/or pattern shape of the second bank BNK2 may be variously changed.

In some embodiments, the second bank BNK2 may be configured to include at least one light blocking and/or reflecting material to prevent light leakage between adjacent pixels PXL. For example, the second bank BNK2 may include at least one black matrix material (for example, at least one known light-blocking material) among various types of black matrix materials and/or a color filter material of a specific color. For example, the second bank BNK2 may be formed in a black opaque pattern to block light. However, it is not limited thereto, and the second bank BNK2 may include scattering particles dispersed in a resin.

The color conversion layer CCL may be disposed on the light emitting elements LD in the opening OP of the second bank BNK2. The color conversion layer CCL may include a first color conversion layer CCL1 disposed on the first pixel PXL1, a second color conversion layer CCL2 disposed on the second pixel PXL2, and a light scattering layer LSL disposed on the third pixel PXL3.

In an embodiment, the first to third pixels PXL1, PXL2, and PXL3 may include the light emitting elements LD that emit light of a same color. For example, the first to third pixels PXL1, PXL2, and PXL3 may include the light emitting elements LD that emit blue light in a wavelength band of about 400 nm to about 500 nm. The color conversion layer CCL including color conversion particles may be disposed on at least some of the pixels PXL among the first to third pixels PXL1, PXL2, and PXL3, and thus a full-color image may be displayed. However, the disclosure is not limited thereto, the first to third pixels PXL1, PXL2, and PXL3 may include light emitting elements LD that emit light of different colors. For example, the first pixel PXL1 may include a first color (or red color) light emitting element LD, the second pixel PXL2 may include a second color (or green color) light emitting element LD, and the third pixel PXL3 may include a third color (or blue color) light emitting element LD.

The first color conversion layer CCL1 may include first color conversion particles that convert light of the third color emitted from the light emitting element LD into light of the first color. For example, in case that the light emitting element LD is a blue light emitting element that emits blue light and the first pixel PXL1 is a red pixel, the first color conversion layer CCL1 may include a first quantum dot QDr that converts blue light emitted from the blue light emitting element into red light. For example, the first color conversion layer CCL1 may include first quantum dots QDr dispersed in a matrix material such as a base resin. The first quantum dot QDr may absorb blue light and shift a wavelength thereof according to energy transition to emit red light in a wavelength band of about 620 nm to about 780 nm. In case that the first pixel PXL1 is a pixel of a different color, the first color conversion layer CCL1 may include a first quantum dot QDr corresponding to a color of the first pixel PXL1.

The second color conversion layer CCL2 may include second color conversion particles that convert light of the third color emitted from the light emitting element LD into light of the second color. For example, in case that the light emitting element LD is a blue light emitting element that emits blue light and the second pixel PXL2 is a green pixel, the second color conversion layer CCL2 may include a second quantum dot QDg that converts blue light emitted from the blue light emitting element into green light. For example, the second color conversion layer CCL2 may include second quantum dots QDg dispersed in a matrix material such as a base resin. The second quantum dot QDg may absorb blue light and shift a wavelength thereof according to energy transition to emit green light in a wavelength band of about 500 nm to about 570 nm. In case that the second pixel PXL2 is a pixel of a different color, the second color conversion layer CCL2 may include a second quantum dot QDg corresponding to a color of the second pixel PXL2.

Each of the first quantum dot QDr and the second quantum dot QDg may be selected from a group II-IV compound, a group IV-VI compound, a group IV element, a group VI compound, and a combination thereof, but the disclosure is not limited thereto.

The first quantum dot QDr and the second quantum dot QDg may have a full width of half maximum (FWHM) of a light emitting wavelength spectrum of about 45 nm or less, and light emitted through the first quantum dot QDr and the second quantum dot QDg may be emitted in a forward direction. Accordingly, a viewing angle of the display device may be improved.

The first quantum dot QDr and the second quantum dot QDg may have a spherical, pyramidal, and multi-arm shape, or a cube of a nanoparticle, a nanotube, a nanowire, a nanofiber, a nanoplate-like particle, etc., but are not limited thereto, and shapes of the first quantum dot QDr and the second quantum dot QDg may be variously changed.

In an embodiment, blue light having a relatively short wavelength among the visible ray bands may be incident on the first quantum dot QDr and the second quantum dot QDg, and thus an absorption coefficient of the first quantum dot QDr and the second quantum dot QDg may be increased. Accordingly, the efficiency of light emitted from the first pixel PXL1 and the second pixel PXL2 may be finally increased, and desired color reproducibility may be ensured. The light source unit LSU of the first, second, and third pixels PXL1, PXL2, and PXL3 may be configured by using the light emitting elements LD of a same color (for example, the blue color light emitting elements), thereby increasing the manufacturing efficiency of the display device.

The light scattering layer LSL may be selectively provided to efficiently use light of a third color emitted from the light emitting element LD. For example, in case that the light emitting element LD is a blue light emitting element that emits blue light and the third pixel PXL3 is a blue pixel, the light scattering layer LSL may include at least one type of light scattering particles SCT to efficiently use the light emitted from the light emitting element LD.

For example, the light scattering layer LSL may include light scattering particles SCT dispersed in a matrix material such as a base resin. For example, the light scattering layer LSL may include the light scattering particles SCT such as a titanium dioxide ($TiO_2$) or silica, but materials included in the light scattering particles SCT are not limited thereto. The light scattering particles SCT need not be disposed only in the third pixel area PXA3 in which the third pixel PXL3 is formed. For example, the light scattering particles SCT may be selectively included in the first and/or second color conversion layers CCL1 and CCL2.

The low refractive layer LRL may be disposed on the color conversion layer CCL. The low refractive layer LRL may improve light efficiency of the display panel PNL by recycling light provided from the color conversion layer CCL by total reflection. To this end, the low refractive layer LRL may have a relatively low refractive index compared to the color conversion layer CCL. For example, a refractive index of the color conversion layer CCL may be about 1.6 to about 2.0, but the disclosure is not limited thereto. A refractive index of the low refractive layer LRL may be about 1.1 to about 1.3, but the disclosure is not limited thereto.

Further, the low refractive layer LRL may be disposed on the color conversion layer CCL and directly contact the color conversion layer CCL. The low refractive layer LRL may prevent impurities such as moisture or air from penetrating into the color conversion layer CCL to damage or contaminate the color conversion layer CCL. Therefore, in case that the color conversion layer CCL is sealed by the low refractive layer LRL, a process for forming a separate capping layer between the low refractive layer LRL and the color conversion layer CCL may be omitted, and it is possible to ensure process economy.

The low refractive layer LRL may be disposed in the opening OP of the second bank BNK2. For example, the low refractive layer LRL may be disposed in each of the light emitting areas EMA of the pixels PXL. Since an expensive low-refractive material may be selectively applied to the light emitting area EMA of each pixel PXL to form the low refractive layer LRL, cost competitiveness may be ensured.

In the process of forming the color conversion layer CCL, the color conversion layer CCL may be formed lower than the second bank BNK2, and although a predetermined step (or height difference) is formed between the color conversion layer CCL and the second bank BNK2, the low refractive layer LRL may be disposed in the opening OP of the second bank BNK2, so that the step due to the color conversion layer CCL may be reduced or minimized. Accordingly, since the color filter layer CFL, which will be described below, may be uniformly formed on the color conversion layer CCL and the low refractive layer LRL, the display quality of the display panel PNL may be improved. Since a separate planarization layer for reducing a step may be omitted, the light efficiency may be improved by minimizing the thickness of the display panel PNL.

In some embodiment, the low refractive layer LRL may include a base resin and hollow particles HP dispersed in the base resin. The base resin may include polysiloxane, polyurethane, acryl, epoxy, phenol, polyamide, or polyimide resin, but the disclosure is not limited thereto. The hollow particles HP may include hollow silica particles. The hollow particle HP may be a pore formed by a porogen, but the disclosure is not limited thereto. The low refractive layer LRL may include at least one of zinc oxide (ZnO) particles, titanium dioxide ($TiO_2$) particles, and nano silicate particles, but the disclosure is not limited thereto.

In an embodiment, a content of the hollow particles HP may be about 10 wt % to about 90 wt % or about 40 wt % to about 70 wt % based on 100 wt % of a solid content of the low refractive layer LRL. A diameter of the hollow particle HP may be about 10 nm to about 100 nm, or about 60 nm to about 100 nm, and a thickness of a shell of the hollow particle HP may be about 5 nm to about 50 nm, but are not limited thereto. In some embodiments, the low refractive layer LRL may further include at least one of a curing agent, a photopolymerization initiator, and an ultraviolet (UV) absorber.

In an embodiment, the second bank BNK2 may have liquid repellency (or repellant) in order to locally form the low refractive layer LRL in the light emitting areas EMA of the pixels PXL. For example, a surface of the second bank BNK2, for example, a side surface of the second bank BNK2 in the opening OP may include a fluorine group (F). In case that the second bank BNK2 has liquid repellency, a low refractive material may be locally applied to the opening OP of the second bank BNK2, and thus the low refractive layer LRL may be easily formed in the light emitting area EMA of each pixel PXL. The low refractive layer LRL may be formed in the opening OP of the second bank BNK2 to directly contact a surface of the second bank BNK2 in the opening OP.

In case that the second bank BNK2 has liquid repellency, the color conversion layer CCL and the low refractive layer LRL may have different thicknesses in the opening OP. This will be described in detail with reference to FIG. 10.

Referring to FIG. 10, the color conversion layer CCL and the low refractive layer LRL may include an edge portion contacting a surface of the second bank BNK2 in the opening OP and a central portion surrounded by the edge portion. Due to the liquid repellency of the surface of the second bank BNK2, a thickness CCLt1 of the edge portion of the color conversion layer CCL in the third direction (Z-axis direction) may be smaller than a thickness CCLt2 of the central portion of the color conversion layer CCL in the third direction (Z-axis direction). Such a thickness distribution of the color conversion layer CCL may be flattened by the low refractive layer LRL. For example, a thickness LRLt1 of the edge portion of the low refractive layer LRL in the third direction (Z-axis direction) may be greater than a thickness LRLt2 of the central portion of the low refractive layer LRL in the third direction (Z-axis direction). The thicknesses LRLt1 and LRLt2 of the low refractive layer LRL in the third direction (Z-axis direction) may be about 0.1 um to about 5.0 um or about 0.5 um to about 2.5 um to simultaneously ensure planarization, light efficiency improvement, and cost reduction by the low refractive layer LRL, but are not limited thereto. For example, the edge portion and the central portion of the color conversion layer CCL may be formed to be substantially flat.

As described above, in the process of forming the color conversion layer CCL, the color conversion layer CCL may be formed to be lower than the second bank BNK2. For example, the thicknesses CCLt1 and CCLt2 of the color conversion layer CCL in the third direction (Z-axis direction) may be smaller than a thickness BNKt of the second bank BNK2 in the third direction (Z-axis direction). Such a step between the color conversion layer CCL and the second bank BNK2 may be flattened by the low refractive layer LRL. For example, a sum of the thickness CCLt1 of the edge portion of the color conversion layer CCL in the third direction (Z-axis direction) and the thickness LRLt1 of the low refractive layer LRL in the third direction (Z-axis direction) may be substantially equal to the thickness BNKt of the second bank BNK2 in the third direction (Z-axis direction). A sum of the thickness CCLt2 of the central portion of the color conversion layer CCL in the third direction (Z-axis direction) and the thickness LRLt2 of the low refractive layer LRL in the third direction (Z-axis direction) may be substantially equal to the thickness BNKt of the second bank BNK2 in the third direction (Z-axis direction), but the disclosure is not limited thereto.

Referring back to FIG. 7, a capping layer CP may be disposed on the low refractive layer LRL. The capping layer CP may be disposed on the low refractive layer LRL and the second bank BNK2 and directly contact them. A surface of the low refractive layer LRL may contact the color conversion layer CCL, and another surface of the low refractive layer LRL may contact the capping layer CP. The capping layer CP may be entirely disposed on the first to third pixels PXL1, PXL2, and PXL3. The capping layer CP may prevent impurities such as moisture or air from penetrating from the outside and damaging and contaminating the color filter layer CFL and/or the color conversion layer CCL. The capping layer CP may prevent a colorant included in the color filter layer CFL from spreading to other constituent elements. The capping layer CP may be an inorganic layer, which may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), and/or silicon oxynitride ($SiO_xN_y$).

The color filter layer CFL may be disposed on the low refractive layer LRL. The color filter layer CFL may include a color filter that matches the color of each pixel PXL. For example, the color filter layer CFL may include a first color filter CF1 that is disposed in the first pixel PXL1 to selectively transmit light generated by the first pixel PXL1, a second color filter CF2 that is disposed in the second pixel PXL2 to selectively transmit light generated by the second pixel PXL2, and a third color filter CF3 that is disposed in the third pixel PXL3 to selectively transmit light generated by the third pixel PXL3. In an embodiment, the first color filter CF1, the second color filter CF2, and the third color filter CF3 may be a red color filter, a green color filter, and a blue color filter, respectively, but the disclosure is not limited thereto. Hereinafter, one of the first color filter CF1, the second color filter CF2, and the third color filter CF3, or two or more thereof collectively may be referred to as the "color filter CF" or "color filters CF."

The first color filter CF1 may overlap the light emitting area EMA of the first pixel PXL1 and may include a color filter material that selectively transmits light of the first color. For example, in case that the first pixel PXL1 is a red pixel, the first color filter CF1 may include a red color filter material.

The second color filter CF2 may overlap the light emitting area EMA of the second pixel PXL2 and may include a color filter material that selectively transmits light of the second color. For example, in case that the second pixel PXL2 is a green pixel, the second color filter CF2 may include a green color filter material.

The third color filter CF3 may overlap the light emitting area EMA of the third pixel PXL3 and may include a color filter material that selectively transmits light of the third color. For example, in case that the third pixel PXL3 is a blue pixel, the third color filter CF3 may include a blue color filter material.

A black matrix BM may be disposed between the color filters CF. The black matrix BM may be disposed in boundary areas of the pixel areas PXA so as to not overlap each light emitting area EMA. For example, the black matrix BM may overlap the second bank BNK2.

The black matrix BM may include at least one black matrix material (for example, at least one known light-blocking material) among various types of black matrix materials, and/or a color filter material of a specific color. The black matrix BM and the second bank BNK2 may be made of a same material, but are not limited thereto. For example, the black matrix BM and the second bank BNK2 may include a same material or different materials. The black matrix BM may be omitted according to embodiments. The first to third color filters CF1, CF2, and CF3 may overlap each other at the boundaries of the pixel areas PXA.

An encapsulation layer ENC may be disposed on the color filter layer CFL. The encapsulation layer ENC may cover or overlap the color filter layer CFL, the color conversion layer CCL, the display layer DPL, and the circuit layer PCL that are disposed therebelow. The encapsulation layer ENC may prevent moisture or air from penetrating into the above-mentioned lower members that are disposed therebelow. To this end, the encapsulation layer ENC may include at least one inorganic layer. For example, the inorganic layer may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), and silicon oxynitride ($SiO_xN_y$), but the disclosure is not limited thereto. The encapsulation layer ENC may protect the above-mentioned lower members from foreign matters such as dust. To this end, the encapsulation layer ENC may include at least one organic layer. For example, the organic layer may be an acryl resin, an epoxy resin, a phenolic resin, a polyamide resin, or a polyimide resin, but the disclosure is not limited thereto. As described above, in case that the encapsulation layer ENC is disposed on the color filter layer CFL, a separate upper substrate may be omitted, and thus the thickness of the display panel PNL may be reduced to improve light efficiency.

The display device of the embodiment described above may have the low refractive layer LRL directly formed on the color conversion layer CCL, so that a process for forming a separate capping layer may be omitted, thereby improving process economy. As the low refractive layer LRL is disposed in the opening OP of the second bank BNK2, the amount of application of the low refractive material may be reduced, thereby securing cost competitiveness. Even if a step is formed between the color conversion layer CCL and the second bank BNK2 in the process of forming the color conversion layer CCL, the low refractive layer LRL may be used to flatten it. Accordingly, since the color filter layer CFL, which will be described below, may be uniformly formed on the color conversion layer CCL and the low refractive layer LRL, the display quality of the display panel PNL may be improved.

Hereinafter, another embodiment will be described. The same elements as those described above will be denoted by the same reference numerals in embodiments below, and repetitive descriptions thereof will be omitted or simplified.

Figure 11:
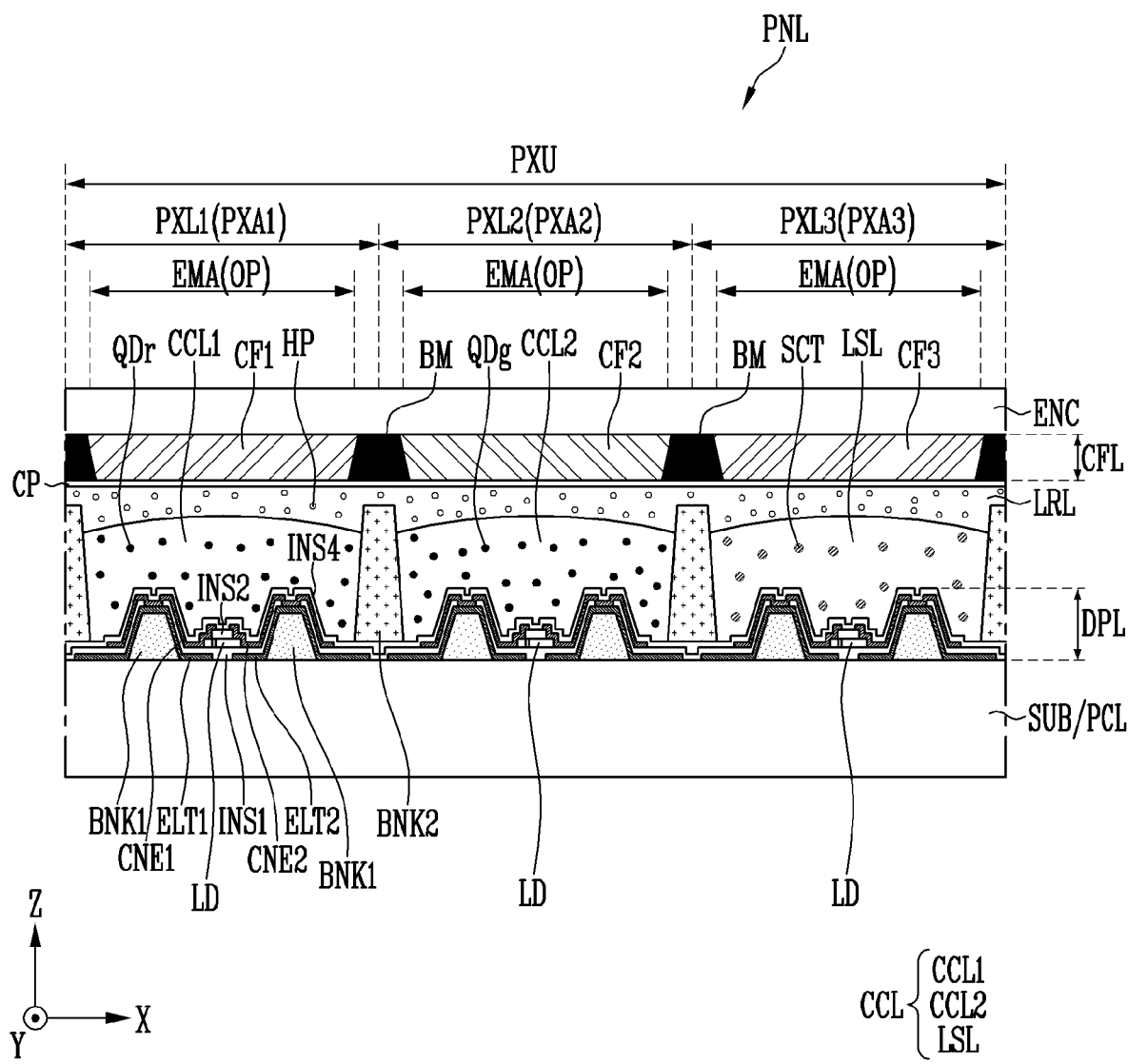
FIG. 11 schematically illustrates a cross-sectional view of a display device according to another embodiment.
Figure 12:
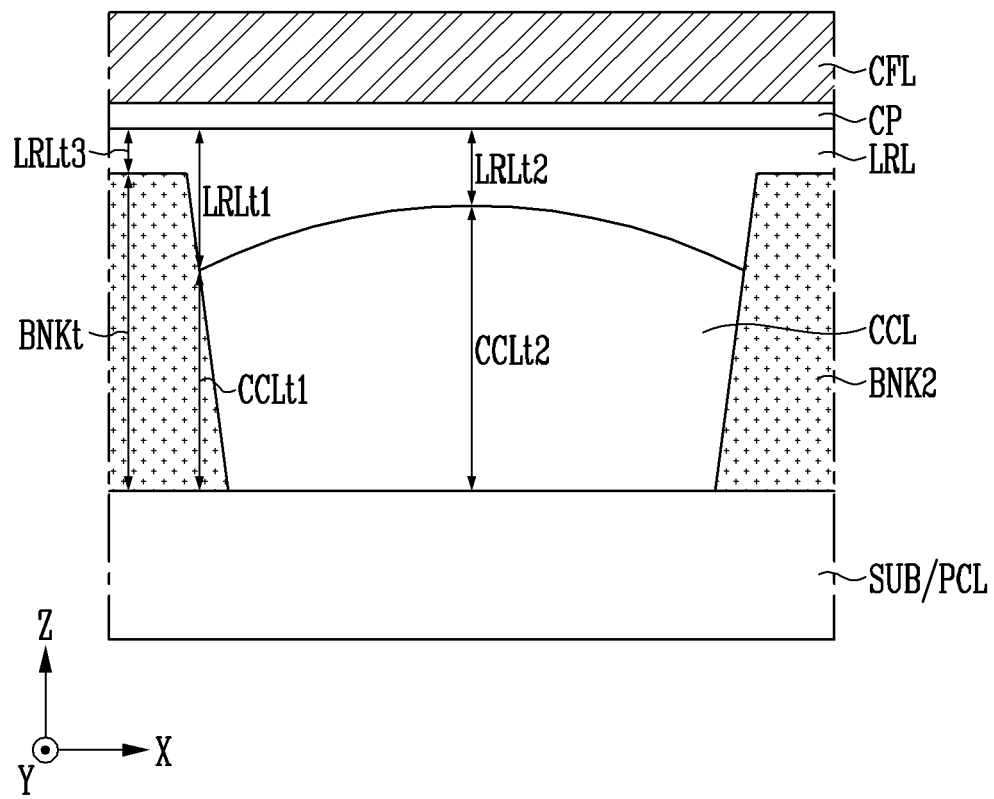
FIG. 12 schematically illustrates a schematic cross-sectional view of the color conversion layer and the low refractive layer of FIG. 11.

FIG. 11 illustrates a schematic cross-sectional view of a display device according to another embodiment. FIG. 12 illustrates a schematic cross-sectional view of the color conversion layer and the low refractive layer of FIG. 11.

Referring to FIGS. 11 and 12, the display device according to the embodiment may be different from the embodiments of FIGS. 1 and 10 at least in that the low refractive layer LRL is further disposed on the second bank BNK2.

Specifically, the low refractive layer LRL may be entirely disposed on the first to third pixels PXL1, PXL2, and PXL3. For example, the low refractive layer LRL may be disposed not only in the light emitting areas EMA of the pixels PXL, but also in a boundary area of the pixel area PXA and/or in an area between adjacent pixels PXL. For example, the low refractive layer LRL may be disposed on the color conversion layer CCL within the opening OP of the second bank BNK2 and may further disposed on the second bank BNK2. Accordingly, the low refractive layer LRL may cover or overlap a surface of the second bank BNK2 exposed by the color conversion layer CCL. In an embodiment, the low refractive layer LRL may be disposed on a surface of the second bank BNK2 exposed by the color conversion layer CCL and directly contact the second bank BNK2.

For example, in the process of forming the low refractive layer LRL, in case that a low refractive material is entirely applied on the second bank BNK2, the low refractive layer LRL may be disposed on the second bank BNK2. Even if the low refractive material is entirely applied over the second bank BNK2, as described above, in case that the surface of the second bank BNK2 has liquid repellency, the low refractive material may be easily introduced into the opening OP of the second bank BNK2. Accordingly, even in case that a step is formed between the color conversion layer CCL and the second bank BNK2 since the color conversion layer CCL is formed lower than the second bank BNK2, the step by the color conversion layer CCL may be reduced or minimized as described above by the low refractive layer LRL disposed in the opening OP of the second bank BNK2.

In some embodiments, the color conversion layer CCL and the low refractive layer LRL may have different thicknesses in each area. This will be described in detail with reference to FIG. 12.

Referring to FIG. 12, the thicknesses LRLt1 and LRLt2, in the third direction (Z-axis direction), of the low refractive layer LRL disposed on the color conversion layer CCL in the opening OP may be greater than a thickness LRLt3, in the third direction (Z-axis direction), of the low refractive layer LRL disposed on the second bank BNK2. The thicknesses LRLt1 and LRLt2 in the third direction (Z-axis direction) of the low refractive layer LRL disposed on the color conversion layer CCL may be formed to be about 3 times or more of the thickness LRLt3 in the third direction (Z-axis direction) of the low refractive layer LRL disposed on the second bank BNK2, but the disclosure is not limited thereto. As described above, in case that the thickness LRLt3 of the low refractive layer LRL disposed on the second bank BNK2 may be formed to be smaller than the thicknesses LRLt1 and LRLt2 of the low refractive layer LRL disposed on the color conversion layer CCL, the application amount of low refractive material may be reduced, and thus cost competitiveness may be secured.

In some embodiments, the color conversion layer CCL and the low refractive layer LRL may include an edge portion contacting a surface of the second bank BNK2 in the opening OP and a central portion surrounded by the edge portion. Because of the liquid repellency of the surface of the second bank BNK2, the thickness CCLt1 of the edge portion of the color conversion layer CCL in the third direction (Z-axis direction) may be smaller than the thickness CCLt2 of the central portion of the color conversion layer CCL in the third direction (Z-axis direction). Such a thickness distribution of the color conversion layer CCL may be flattened by the low refractive layer LRL. For example, the thickness LRLt1 of the edge portion of the low refractive layer LRL in the third direction (Z-axis direction) may be greater than the thickness LRLt2 of the central portion of the low refractive layer LRL in the third direction (Z-axis direction). However, it is not limited thereto, and the edge portion and the central portion of the color conversion layer CCL may be formed to be substantially flat.

The capping layer CP may be disposed on the low refractive layer LRL. The capping layer CP may be formed on the entire surface of the low refractive layer LRL. The capping layer CP may be disposed on the low refractive layer LRL and directly contact the low refractive layer LRL.

Since the color conversion layer CCL, the low refractive layer LRL, and the capping layer CP have been described with reference to FIGS. 1 to 10, repetitive descriptions thereof are omitted.

Figure 13:
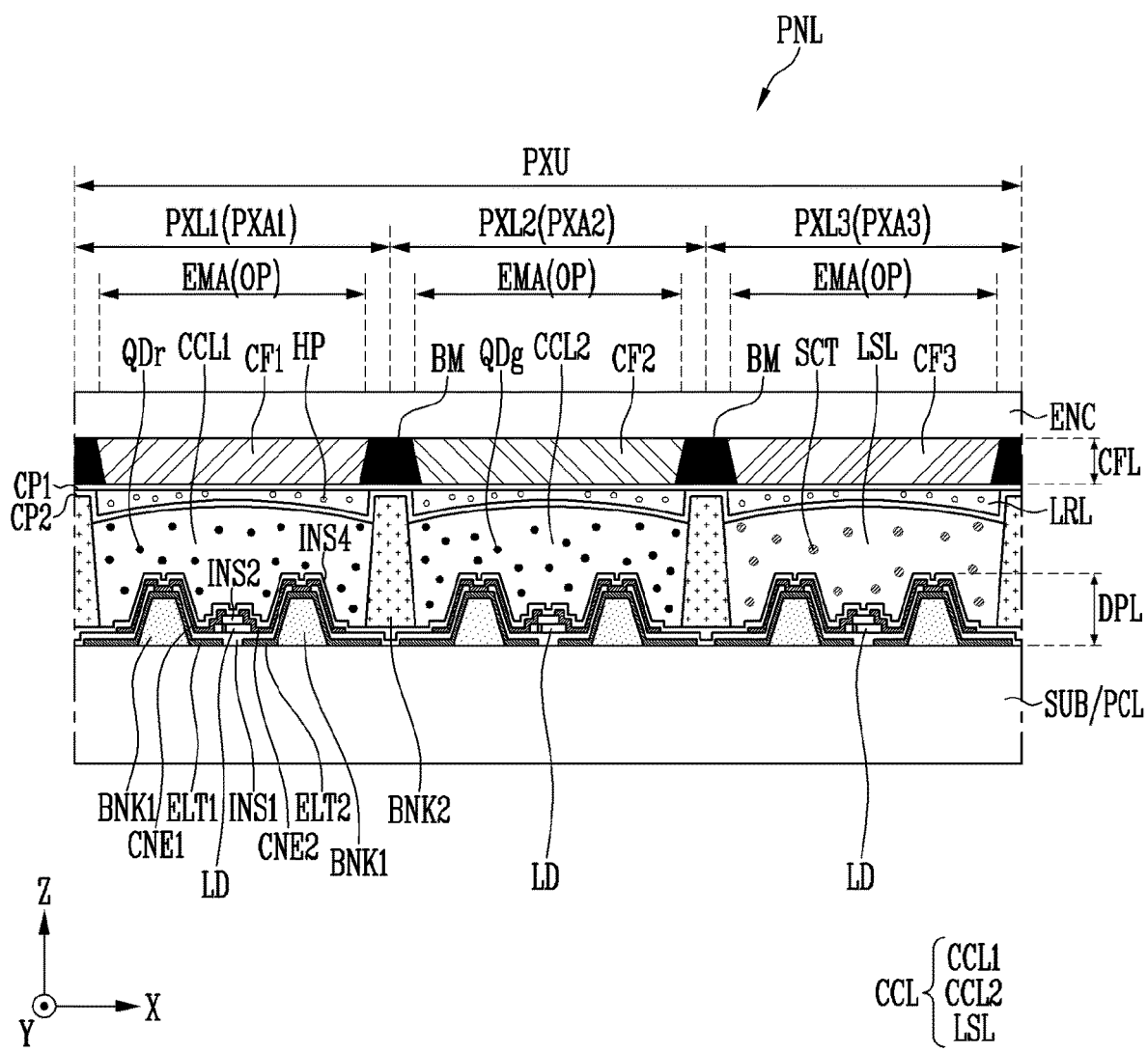
FIG. 13 and FIG. 14 schematically illustrate cross-sectional views of a display device according to another embodiment.
Figure 14:
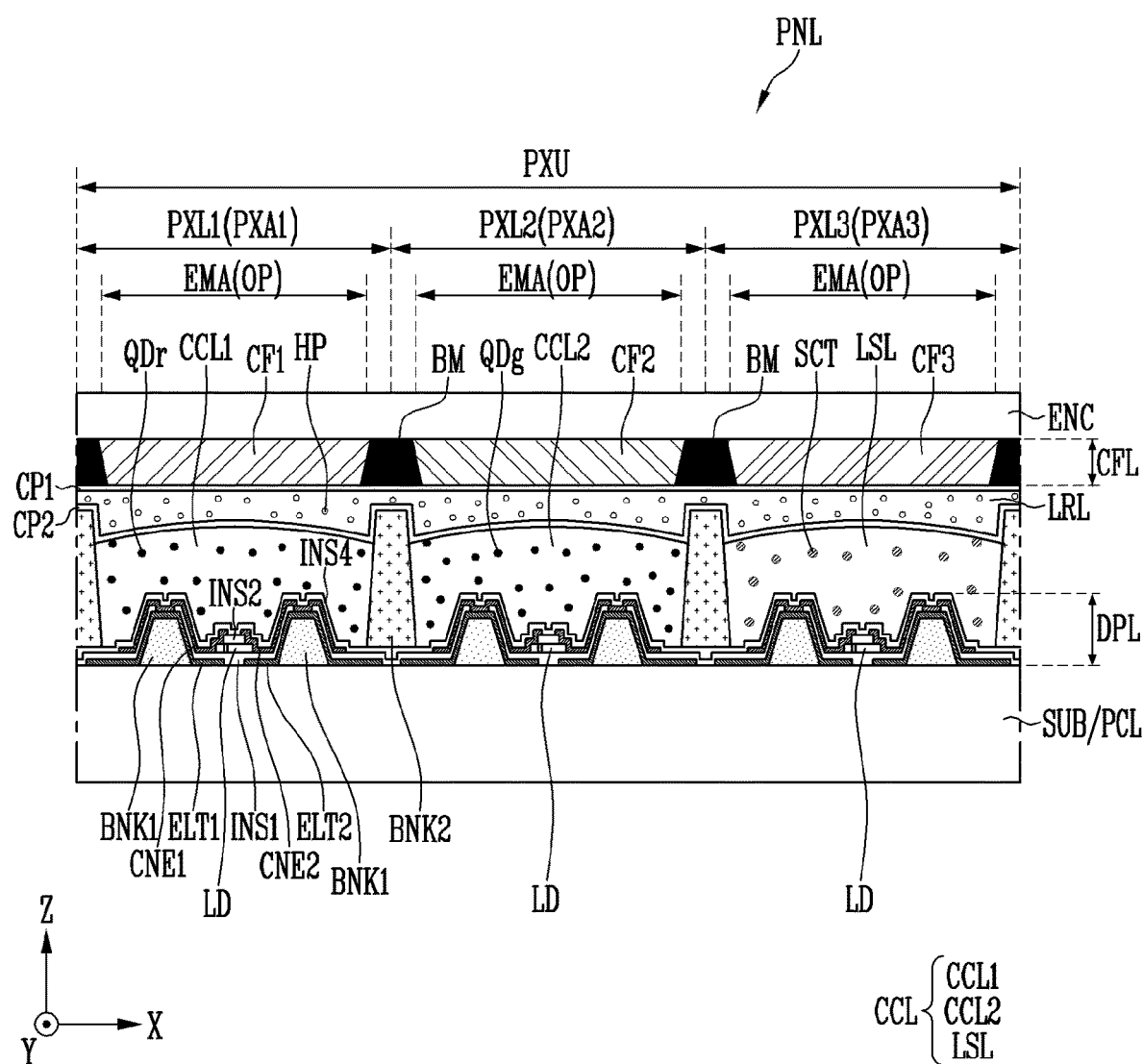

FIGS. 13 and 14 illustrate schematic cross-sectional views of a display device according to another embodiment.

Referring to FIGS. 13 and 14, the display device according to the embodiment may differ from the embodiments of FIGS. 1 to 10 at least in that the display device includes a first capping layer CP1 disposed on a surface of the low refractive layer LRL and a second capping layer CP2 disposed on another surface of the low refractive layer LRL.

Specifically, the first capping layer CP1 may be disposed on the low refractive layer LRL and directly contact the low refractive layer LRL. A surface of the first capping layer CP1 may contact the color filter layer CFL, and another surface of the first capping layer CP1 may contact the low refractive layer LRL.

The second capping layer CP2 may be disposed on the color conversion layer CCL and/or the second bank BNK2 and directly contacts the color conversion layer CCL and/or the second bank BNK2. A surface of the second capping layer CP2 may contact the low refractive layer LRL, and another surface of the second capping layer CP2 may contact the color conversion layer CCL and/or the second bank BNK2.

The first capping layer CP1 and the second capping layer CP2 may be entirely disposed on the first to third pixels PXL1, PXL2, and PXL3. The first capping layer CP1 and the second capping layer CP2 may prevent impurities such as moisture or air from penetrating from the outside and damaging or contaminating the color filter layer CFL and/or the color conversion layer CCL. The first capping layer CP1 and the second capping layer CP2 may prevent a colorant included in the color filter layer CFL from spreading to other constituent elements. The first capping layer CP1 and the second capping layer CP2 may be inorganic layers, which may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), and silicon oxynitride ($SiO_xN_y$). In an embodiment, the first capping layer CP1 and the second capping layer CP2 may be made of a same material, but the disclosure are not limited thereto.

In some embodiments, the first capping layer CP1 and the second capping layer CP2 may directly contact each other. For example, as shown in FIG. 13, the first capping layer CP1 and the second capping layer CP2 may contact each other on the second bank BNK2. Since an area in which the low refractive layer LRL contacts the first capping layer CP1 and/or the second capping layer CP2 may be reduced or minimized, interface stress may be reduced or minimized. However, the disclosure is not limited thereto, and as shown in FIG. 14, in case that the low refractive layer LRL is further disposed on the second bank BNK2, the low refractive layer LRL may be disposed between the first capping layer CP1 and the second capping layer CP2, so that the first capping layer CP1 and the second capping layer CP2 may not contact each other.

Since the color conversion layer CCL and the low refractive layer LRL have been described with reference to FIGS. 1 to 10, repetitive descriptions thereof are omitted.

Figure 15:
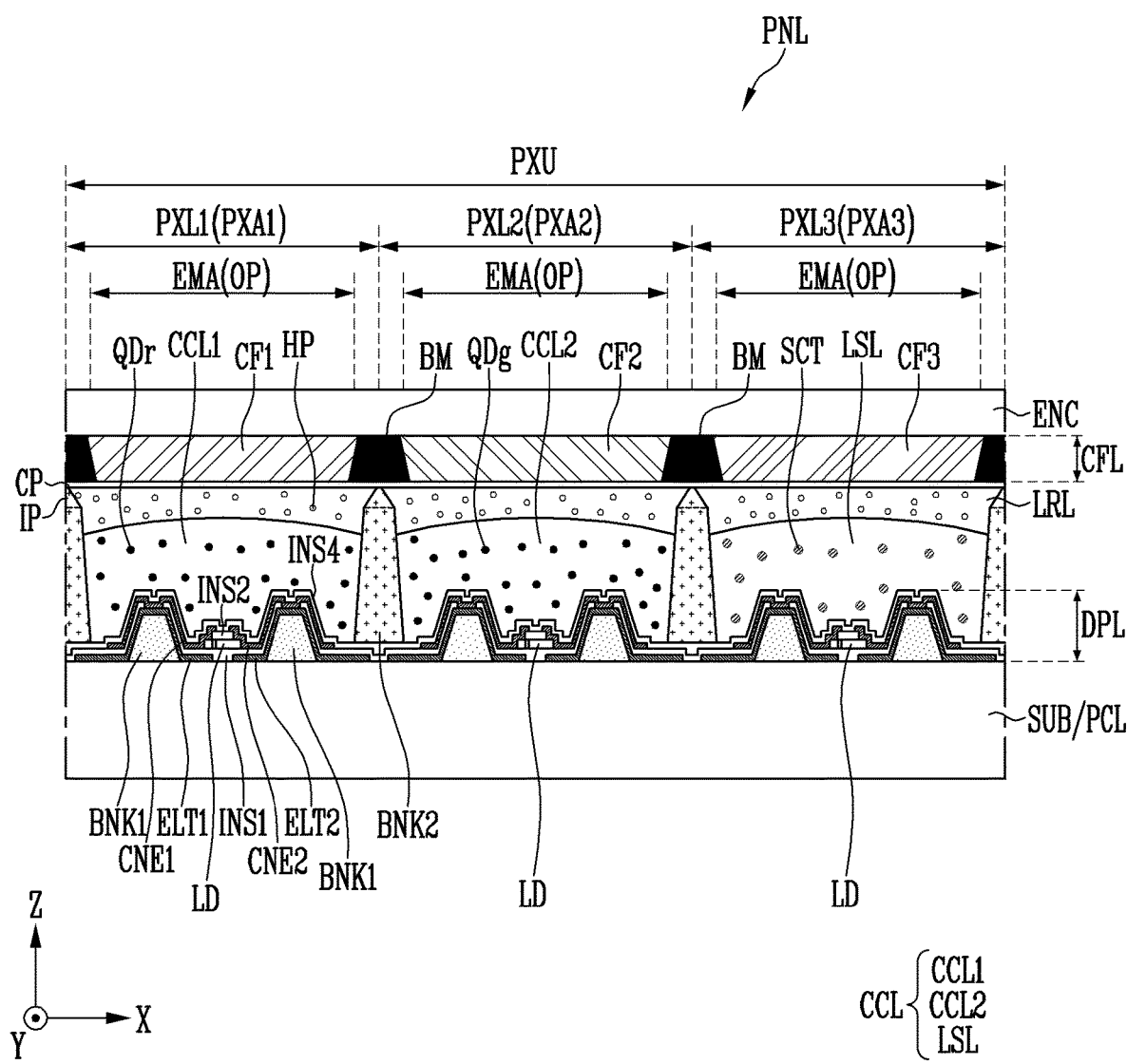
FIG. 15 schematically illustrates a cross-sectional view of a display device according to another embodiment.
Figure 16:
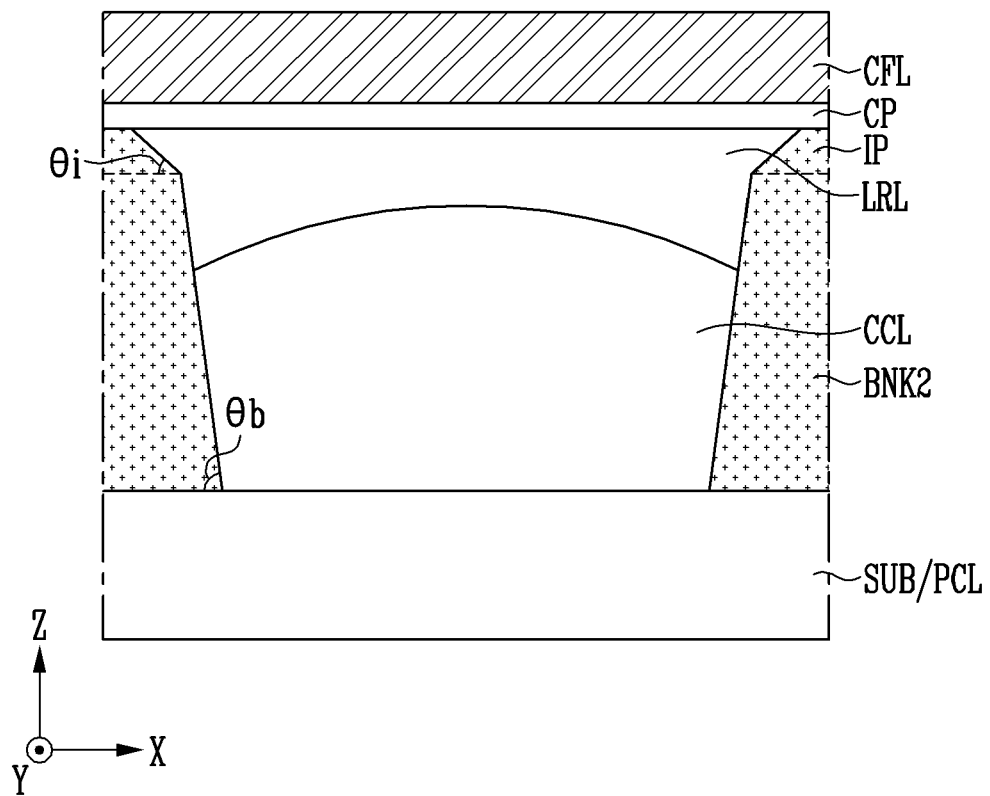
FIG. 16 schematically illustrates a schematic cross-sectional view of the second bank and the inclination pattern of FIG. 15.

FIG. 15 illustrates a schematic cross-sectional view of a display device according to another embodiment. FIG. 16 illustrates a schematic cross-sectional view of the second bank and the inclination pattern of FIG. 15.

Referring to FIGS. 15 and 16, the display device according to the embodiment may be different from the embodiments of FIGS. 1 to 10 at least in that an inclination pattern IP disposed on the second bank BNK2 is further included.

Specifically, the inclination pattern IP may protrude from the upper surface of the second bank BNK2 in a height direction of the substrate SUB, for example, the third direction (Z-axis direction). The inclination pattern IP may have various shapes according to embodiments. In an embodiment, the inclination pattern IP may have a positively tapered structure. For example, the inclination pattern IP may be formed to have an inclination surface inclined at a predetermined angle with respect to the substrate SUB as shown in FIGS. 15 and 16. However, it is not limited thereto, and the inclination pattern IP may have a curved side wall. For example, the inclination pattern IP may have a cross-section having a semicircular or semielliptical shape.

The inclination pattern IP may include at least one organic material and/or inorganic material. As an example, the inclination pattern IP may include an organic film and/or photoresist film including various types of organic insulation materials and formed as at least one layer. The inclination pattern IP may include an inorganic film including various inorganic insulation materials including a silicon nitride ($SiN_x$) or silicon oxide ($SiO_x$) and formed as at least one layer, or a single-layered or multi-layered insulator including organic/inorganic materials in combination. For example, the material and/or pattern shape of the inclination pattern IP may be variously changed. In some embodiments, the inclination pattern IP and the second bank BNK2 may be made of a same material. Since the inclination pattern IP and the second bank BNK2 may be simultaneously formed by the same process, the manufacturing process of the display device may be simplified. For example, the inclination pattern IP and the second bank BNK2 may be simultaneously patterned by controlling a process condition or using a halftone mask or slit mark. The inclined pattern IP may be formed on the second bank BNK2 by introducing an additive such as a leveling agent or a reflow agent. However, it is not limited thereto, and the inclination pattern IP may be sequentially formed on the upper surface of the second bank BNK2.

An inclination angle θi of the inclination pattern IP may be smaller than an inclination angle θb of the second bank BNK2. Here, the inclination angles θi and θb may be an acute angle formed between each of the inclination pattern IP and the second bank BNK2 and the upper surface of the substrate SUB.

In case that the inclination pattern IP is formed on the second bank BNK2, even if the low refractive material is entirely applied on the second bank BNK2 in the process of forming the low refractive layer LRL, the low refractive material may be easily introduced into the opening OP of the second bank BNK2 by the inclination pattern IP. Therefore, as described above, it is possible to secure cost competitiveness by reducing the application amount of the low refractive material.

Since the color conversion layer CCL, the low refractive layer LRL, and the second bank BNK2 have been described with reference to FIGS. 1 to 10, repetitive descriptions thereof are omitted.

Those skilled in the art related to the embodiment will readily appreciate that many modifications are possible without materially departing from the novel teachings and advantages. The embodiments should be considered in a descriptive sense only and not for purposes of limitation. All modifications within the equivalent scope of the disclosure will be construed as being included in the disclosure.

What is claimed is:

1. A display device comprising:
   a bank including an opening defining a plurality of pixels;
   a plurality of light emitting elements disposed in the plurality of pixels;
   a color conversion layer disposed on the plurality of light emitting elements in the opening; and
   a first refractive layer disposed on the color conversion layer in the opening, the first refractive layer being a solid and having a refractive index lower than a refractive index of the color conversion layer.

2. The display device of claim 1, wherein the first refractive layer is disposed on the color conversion layer and directly contacts the color conversion layer.

3. The display device of claim 1, wherein the first refractive layer includes at least one surface that contacts at least one of the bank, a capping layer, or the color conversion layer in the opening.

4. A display device comprising:
   a bank including an opening defining a plurality of pixels;
   a plurality of light emitting elements disposed in the plurality of pixels;
   a color conversion layer disposed on the plurality of light emitting elements in the opening; and
   a first refractive layer disposed on the color conversion layer in the opening, wherein
   the first refractive layer includes:
      an edge portion contacting the bank in the opening; and
      a central portion surrounded by the edge portion, and
   a thickness of the edge portion of the first refractive layer is thicker than a thickness of the central portion of the first refractive layer.

5. The display device of claim 4, further comprising a capping layer overlapping the first refractive layer.

6. The display device of claim 5, wherein
   a surface of the first refractive layer contacts the color conversion layer, and
   another surface of the first refractive layer contacts the capping layer.

7. The display device of claim 5, wherein the capping layer is disposed on the bank and directly contacts the bank.

8. The display device of claim 5, wherein the capping layer includes at least one of a silicon oxide ($SiO_x$), a silicon nitride ($SiN_x$), a silicon oxynitride ($SiO_xN_y$), an aluminum oxide ($AlO_x$), and a titanium oxide ($TiO_x$).

9. The display device of claim 1, wherein a surface of the bank has liquid repellency.

10. The display device of claim 1, further comprising a color filter layer overlapping the color conversion layer,
    wherein the first refractive layer is disposed between the color conversion layer and the color filter layer.

11. The display device of claim 1, wherein the first refractive layer includes:
    a first resin; and
    hollow particles dispersed in the first resin.

12. The display device of claim 1, wherein the color conversion layer includes:
    a base resin; and
    quantum dots dispersed in the base resin.

13. A display device comprising:
    a bank including an opening defining a plurality of pixels;
    a plurality of light emitting elements disposed in the plurality of pixels;
    a color conversion layer disposed on the plurality of light emitting elements in the opening;
    a first refractive layer disposed on the color conversion layer in the opening; and
    a capping layer disposed between the color conversion layer and the first refractive layer.

14. The display device of claim 1, further comprising an inclination pattern disposed on the bank,
    wherein an inclination angle of the inclination pattern with respect to a substrate is smaller than an inclination angle of the bank with respect to the substrate.

15. A display device comprising:
    a bank including an opening defining a plurality of pixels;
    a plurality of light emitting elements disposed in the plurality of pixels;
    a color conversion layer disposed on the plurality of light emitting elements in the opening; and
    a first refractive layer disposed on the color conversion layer, the first refractive layer being a solid and having a refractive index lower than a refractive index of the color conversion layer, wherein
    the first refractive layer overlaps a surface of the bank exposed by the color conversion layer.

16. The display device of claim 15, wherein the first refractive layer is disposed on the color conversion layer and directly contacts the color conversion layer.

17. The display device of claim 15, wherein the first refractive layer is disposed on the bank and directly contacts the bank.

18. The display device of claim 15, wherein a thickness of the first refractive layer on the color conversion layer is thicker than a thickness of the first refractive layer on the bank.

19. The display device of claim 15, further comprising a capping layer overlapping the first refractive layer.

20. The display device of claim 19, wherein
a surface of the first refractive layer contacts the color conversion layer, and
another surface of the first refractive layer contacts the capping layer.

21. The display device of claim 1, wherein
a refractive index of the first refractive layer is 1.1 to 1.3, and
a refractive index of the color conversion layer is 1.6 to 2.0.

* * * * *